(12) United States Patent
Mantha et al.

(10) Patent No.: US 8,140,950 B2
(45) Date of Patent: *Mar. 20, 2012

(54) HYBRID AUTOMATIC REPEAT REQUEST SYSTEM AND METHOD

(75) Inventors: Ramesh Mantha, Toronto (CA); Frank Kschischang, Mississauga (CA)

(73) Assignee: Research in Motion Limited, Waterloo (CA)

( * ) Notice: Subject to any disclaimer, the term of this patent is extended or adjusted under 35 U.S.C. 154(b) by 909 days.

This patent is subject to a terminal disclaimer.

(21) Appl. No.: 12/177,933

(22) Filed: Jul. 23, 2008

(65) Prior Publication Data

US 2008/0282127 A1    Nov. 13, 2008

Related U.S. Application Data

(63) Continuation of application No. 11/282,900, filed on Nov. 18, 2005, now Pat. No. 7,421,644, which is a continuation of application No. 10/168,516, filed as application No. PCT/CA00/01519 on Dec. 19, 2000, now Pat. No. 7,000,174.

(60) Provisional application No. 60/172,676, filed on Dec. 20, 1999.

(51) Int. Cl.
*G06F 11/10* (2006.01)
*G06F 11/25* (2006.01)

(52) U.S. Cl. .................... 714/800; 714/790
(58) Field of Classification Search ............. None
See application file for complete search history.

(56) References Cited

U.S. PATENT DOCUMENTS

| | | | |
|---|---|---|---|
| 4,295,218 A | 10/1981 | Tanner | |
| 5,566,189 A | 10/1996 | Laskowski | |
| 5,710,798 A | 1/1998 | Campana, Jr. | |
| 5,850,405 A * | 12/1998 | Wimmer et al. | 714/790 |
| 5,946,707 A | 8/1999 | Krakirian | |
| 6,085,285 A * | 7/2000 | Lucas et al. | 711/112 |
| 6,108,810 A * | 8/2000 | Kroeger et al. | 714/790 |
| 6,289,486 B1 * | 9/2001 | Lee et al. | 714/788 |
| 6,487,693 B1 * | 11/2002 | Kim et al. | 714/786 |
| 6,601,214 B1 | 7/2003 | Hammons, Jr. | |
| 7,000,174 B2 | 2/2006 | Mantha et al. | |

FOREIGN PATENT DOCUMENTS

EP    1 045 521 A2    10/2000

OTHER PUBLICATIONS

Miyagi et al.: "Selective Repeat Type-II Hybrid FEC/ARQ Systems Using Concatenated Codes," Electronics and Communications in Japan, Part I, vol. 76, No. 6, Jun. 1993, pp. 25-34.
Mantha, et al.: "An Efficient Software Implementation of a Variable Rate Modem," International Mobile Satellite Conference, Jun. 1995, pp. 8-12.

* cited by examiner

*Primary Examiner* — Jeffrey A Gaffin
*Assistant Examiner* — Dipakkumar Gandhi
(74) *Attorney, Agent, or Firm* — Jones Day

(57) ABSTRACT

A data communication method for puncturing of parity bits defining all parity data for a minimum code rate generated by an encoder is disclosed. The method initializes an accumulator associated with the parity bits to an initial value, and for each parity bit increments the accumulator by a increment value and determines if the accumulator has overflowed. If the accumulator overflows, at least one of the parity bits is selected for transmission.

22 Claims, 17 Drawing Sheets

HYBRID AUTOMATIC REPEAT REQUEST SYSTEM AND METHOD

This application is a continuation of U.S. patent application Ser. No. 11/282,900, filed on Nov. 18, 2005, now U.S. Pat. No. 7,421,644, which is a continuation of U.S. patent application Ser. No. 10/168,516, filed on Sep. 18, 2002, now U.S. Pat. No. 7,000,174, which, in turn, is a filing under 35 U.S.C. §371 and claims priority to Patent Cooperation Treaty (PCT) App. Ser. No. PCT/CA00/01519, filed on Dec. 19, 2000, which, in turn, claims priority to U.S. provisional application Ser. No. 60/172,676 filed on Dec. 20, 1999. The entire disclosures of U.S. patent application Ser. Nos. 11/282,900, 10/168,516 and 60/172,676 and PCT App. Ser. No. PCT/CA00/01519 are incorporated herein by reference.

BACKGROUND

1. Technical Field

The present invention is generally directed to the field of data communications, and more specifically to data communication system utilising automatic repeat request (ARQ) systems and protocols, and to hybrid ARQ (HARQ).

2. Description of the Related Art

The past decade has seen an explosion in the development and deployment of communications systems. Advances in network, wireless and fiber-optic technologies have revolutionized modern communications. Even some of the most sophisticated communications technologies have achieved levels of cost and ease of use facilitating widespread accessibility.

Communications systems are typically designed with the goal of maximizing performance given such system constraints as power, bandwidth and data rate. There are many quantitative measures of system performance, the most relevant measure depending on the nature of the particular system. In general, systems can broadly be divided into two categories, those with and those without feedback channels. In a system with a single transmitter and a single receiver, the presence of a feedback channel allows the receiver to send information back to the transmitter pertaining to the success or failure of the transmission. Applications which have feedback channels are typically delay insensitive.

In systems without a feedback channel, the performance may for example be defined by the bit error rate (BER). The BER is the probability that a transmitted bit will be decoded erroneously by the receiver. In any digital communications system, the BER decreases and performance improves with higher transmitted signal power. However, given power constraints, a desirable goal is to improve BER performance without increasing power requirements, or alternately, to achieve a given BER with less power. Particularly in wireless, mobile, and other battery-powered or limited-power communication systems and devices, power consumption is a primary concern.

Forward error correction (FEC) is a known technique for improving BER without increasing power or achieving a desired BER with less power. FEC involves adding controlled redundancy to source or transmitted data in a manner that allows a receiver to detect and correct errors that occur on a transmission channel. This increases the immunity of the transmitted signal to noise without increasing signal power.

When a feedback channel is available, automatic repeat request (ARQ) schemes can be implemented. ARQ schemes typically operate with frames of information data. The frames consist of information bits and error-detecting cyclic redundancy check (CRC) bits, implemented with a cyclic code. A receiver uses the CRC bits to determine if any bit errors have occurred and, if so, requests a retransmission of the frame by sending a negative acknowledgment (NAK; i.e., an error indication) on the feedback channel. This is repeated until the frame is received without errors, in which case a positive acknowledgment (ACK) is sent. The BER of ARQ schemes is determined by the undetected error rate of the error detecting code and is usually selected to be very low, effectively zero. The BER is therefore inappropriate as a measure of ARQ system performance. Instead, throughput, defined as the average number of encoded data bits accepted by the receiver in the time it takes the transmitter to send a single bit, is used to measure performance. Throughput can be viewed as a measure of the retransmission overhead of the ARQ scheme. Throughput is measured in bits/channel use and is upper-bounded by the channel capacity.

Hybrid ARQ (HARQ) systems combine FEC and ARQ in order to improve ARQ throughput performance. In pure ARQ systems, the probability of a frame being in error is a function of channel bit error rate and frame length. The redundant bits generated by a FEC code, also known as parity bits, are incorporated into the frame based retransmission approach of ARQ systems. By incorporating FEC, the frame error rate (FER), which is a measure similar to BER described above but based on frames instead of bits, can be reduced significantly. This accordingly reduces the number of retransmissions required and therefore improves throughput performance, but requires more complex transmitter and receiver designs to provide for FEC.

Early HARQ systems simply add FEC redundancy to every transmitted frame. The receiver then uses the decoding algorithm corresponding to the FEC scheme to estimate the bits of the frame. The CRC is then computed to determine of the received frame contains errors and if so, retransmission of the frame may be requested. In the event of a retransmission request, the process is repeated. This limits the throughput to a maximum value equal to the rate of the FEC code used. For example, if a rate ½ code is used, the maximum throughput is 0.5. Such a system is known as type-I HARQ system. In some cases, type-I HARQ systems use the same code for both error detection and error correction.

A more sophisticated approach is to use the idea of incremental redundancy. Systems using this approach are known as type-II HARQ systems and adaptively vary the amount of additional parity bits sent to the receiver. A type-II HARQ protocol operates to initially transmit only information bits and CRC bits. Subsequent retransmission requests entail incremental transmission of parity bits. Each parity increment is combined with the previously received symbols by a decoder in the receiver in order to decode the frame with a lower frame error rate (FER) than before. After each retransmission, the receiver is decoding a more powerful, lower rate code. It is essential that the FEC used in type-II HARQ systems is a rate compatible code. Rate compatibility ensures that when a family of different rate codes is generated by puncturing a single low rate code, the parity bits used in any member of the family includes all the parity bits used in all higher rate members of the family.

Type-II HARQ systems have the ability to vary their throughput dynamically as channel conditions change. This adaptability makes such systems particularly useful in applications with fluctuating channel conditions, such as mobile and satellite packet data, where a feedback channel is available and latency due to retransmission delay is acceptable.

There has been a great deal of previous work in the area of HARQ systems. However, most of this work has been based on codes less powerful than turbo or low density parity check (LDPC) codes. Such systems have been developed using Bose-Chaudhuri-Hochquenghem (BCH) codes, half-rate invertible codes, rate ½ convolutional codes and complementary convolutional codes. However, the throughput of such known systems does not approach the limit of channel capacity.

One known turbo code based HARQ system is described in K. R. Narayanan and G. L. Stüber, "A Novel ARQ Technique Using the Turbo Coding Principle", *IEEE Commun. Letters*, vol. 1, pp. 49-51, March 1997. In this system, a rate ½ turbo encoder is used. The systematic and parity bits from the encoder are sent in the initial transmission. In response to a NAK, the systematic data is interleaved with a different interleaver from the one used in the turbo encoder and is then encoded with the same rate ½ turbo encoder that was used for the initial transmission. The systematic and parity bits from this encoding are then sent. This is repeated with each NAK with a different interleaver used each time. The decoder is similar to a standard turbo decoder except that the results of a previous frame's decoding are used as the initial extrinsic information in the next frame's decoding. As will become apparent from the detailed description of the present invention below, this scheme is different from the present invention, such as, for example that all parity bits are transmitted in every transmitted and retransmitted frame.

A known type-I HARQ system using a rate ½ turbo code is described in J. Hámorský, U. Wachsmann, J. B. Huber and A. Čižmár, "Hybrid Automatic Repeat Request Scheme with Turbo Codes", *Proc. of International Symposium on Turbo Codes and Related Topics*, Brest, France, September 1997. Here, every transmitted frame includes the parity bits from a rate ½ turbo code, in addition to the information bits. This scheme has a maximum throughput of only 0.5.

A further known HARQ scheme disclosed for example in D. N. Rowitch and L. B. Milstein, "Rate Compatible Punctured Turbo (RCPT) Codes in a Hybrid FEC/ARQ System", *Proc. IEEE GLOBECOM '97*, Phoenix, Ariz., November 1997, is restricted to only certain particular code rates and requires more complex encoding and decoding arrangements relative to those in accordance with aspects of the instant invention.

These previous approaches lack, for example, a HARQ system and method having improved throughput approaching channel capacity. These previous approaches also lack a HARQ scheme which provides for arbitrary code rates without requiring more complex encoding and decoding arrangements. For example, R. Mantha, A. Hunt and S. Crozier, "An Efficient Software Implementation of a Variable Rate Modem", *Proc. 4th International Mobile Satellite Conferences*, Ottawa, ON, Canada, June 1995, pp. 8-12, disclosed an approach that is significantly different from the present invention in that it related to a variable rate modem, not to puncturing in a HARQ system.

SUMMARY OF THE INVENTION

The present invention solves the aforementioned disadvantages as well as other disadvantages of the prior approaches. In accordance with the teachings of the present invention, a data communication method and system is provided for uniform arbitrary puncturing of parity bits generated by an encoder. The parity bits are stored in a buffer, and an a-bit accumulator is incremented to a predetermined initial value. For each parity bit in the buffer, the following steps are performed: the accumulator is incremented by a predetermined increment value, and if the accumulator overflows, the parity bit is selected for transmission. The predetermined initial value and the predetermined increment value are selected to achieve a desired amount of puncturing. One non-limiting advantage of the present invention is that it uses code puncturing in conjunction with powerful turbo and LDPC codes to achieve this goal.

In the invention, a data communication method for puncturing of parity bits generated by an encoder, comprises the steps of storing the parity bits in a buffer, initializing an accumulator to a preselected initial value and, for each parity bit in the buffer, performing the steps of incrementing the accumulator by a preselected increment value and if the accumulator overflows, selecting at least one of the stored parity bits for transmission.

A data communication device in accordance with an aspect of the invention comprises a communication signal transmitter for assembling information into transmission signal blocks and for transmitting the assembled transmission signal blocks to a receiver, an encoder for encoding input information to generate encoded information, error check information and parity information, a memory buffer for storing the parity information generated by the encoder, and an accumulator that overflows when incremented beyond a preselected value, wherein, for each bit of the parity information, the accumulator is incremented by a preselected increment value, and the communication signal transmitter selects at least a portion of the parity information for transmission to the receiver with at least one of the assembled transmission signal blocks upon a detection of an overflow of the accumulator.

The initial value and the increment value are selected to achieve a preselected amount of puncturing, and are preferably selected (i) based upon the size of the accumulator, the desired amount of puncturing, or both, and (ii) to ensure substantially uniform puncturing. Selected parity bits may be transmitted with an initial transmission, but are preferably only transmitted if an error indication relating to the initial transmission is received. A data communication method in accordance with this aspect of the invention preferably follows a HARQ protocol, such that different parity bits are transmitted in response to each repeat request relating to the same portion of a transmission. Such different parity bits may be selected by setting different initial values in the accumulator and selecting different increment values. An encoder which generates the parity bits is preferably a LDPC encoder or a turbo encoder.

According to a further preferred embodiment, the invention comprises a communication method which follows a HARQ protocol. The method includes the steps of encoding input information to generate encoded information, error check information and parity bits according to a LDPC encoding scheme, puncturing the parity bits to generate incremental parity blocks, assembling the encoded information and error check information into transmission signal blocks, and transmitting each assembled transmission signal block to a receiver on a communication medium. If a repeat request for a particular transmission signal block is received from the receiver, then one of the incremental parity blocks associated with the particular transmission signal block is assembled into an incremental parity transmission signal block and the incremental parity transmission signal block is transmitted to the receiver. These steps are repeated for each subsequent repeat request for the particular transmission signal block until all incremental parity blocks have been transmitted.

A communication device in accordance with this further aspect of the invention is configured for operation according to a HARQ protocol. The device comprises a communication signal transmitter for assembling information into transmission signal blocks and for transmitting the assembled transmission signal blocks on a communication medium, a communication signal receiver for receiving repeat requests from the communication medium in accordance with the HARQ protocol, a LDPC encoder for encoding input information to generate encoded information, error check information and parity information, a memory buffer for storing the parity information generated by the LDPC encoder, and means for puncturing the parity information stored in the memory buffer to generate an incremental parity block, wherein the communication signal transmitter assembles the encoded information and the error check information into blocks for transmission over the communication medium to a remote communication device, and if a repeat request is received by the communication signal receiver from the remote device, then the communication signal transmitter assembles the incremental parity block into an incremental parity transmission signal block and transmits the incremental parity transmission signal block to the remote device. The means for puncturing preferably generates a plurality of incremental parity blocks, and if subsequent repeat requests for the same transmission signal block are received by the communication signal receiver from the remote device, then the communication signal transmitter assembles a different incremental parity block into an incremental parity transmission signal block and transmits the incremental parity transmission signal block to the remote device.

The degree or amount of puncturing applied to the parity bits or information may possibly be determined by an intended receiver to which information is transmitted. The receiver preferably measures signal quality, such as a signal to noise ratio (SNR), on a communication medium to determine the amount of puncturing, although the amount of puncturing may also be determined based on a desired quality of service (QoS).

The communication methods and devices according to the invention may be implemented as hardware, computer software, or a combination of both. Systems in which application of the invention is contemplated include, but are in no way limited to, satellite-to-earth communication links, two-way communication systems, mobile communication devices and systems, wireless modems, cellular telephones, personal digital assistants (PDAs) enabled with communication functions and two-way pagers. In particular preferred embodiments, the invention is implemented in portable information browsing devices running wireless Internet-based applications. Other implementations will be obvious to those skilled in the art to which the invention pertains.

Further features of the invention will be described or will become apparent in the course of the following detailed description.

BRIEF DESCRIPTION OF THE DRAWINGS

In order that the invention may be more clearly understood, preferred embodiments thereof will now be described in detail by way of example, with reference to the accompanying drawings, in which.

DETAILED DESCRIPTION OF THE PREFERRED EMBODIMENT

Figure 16:
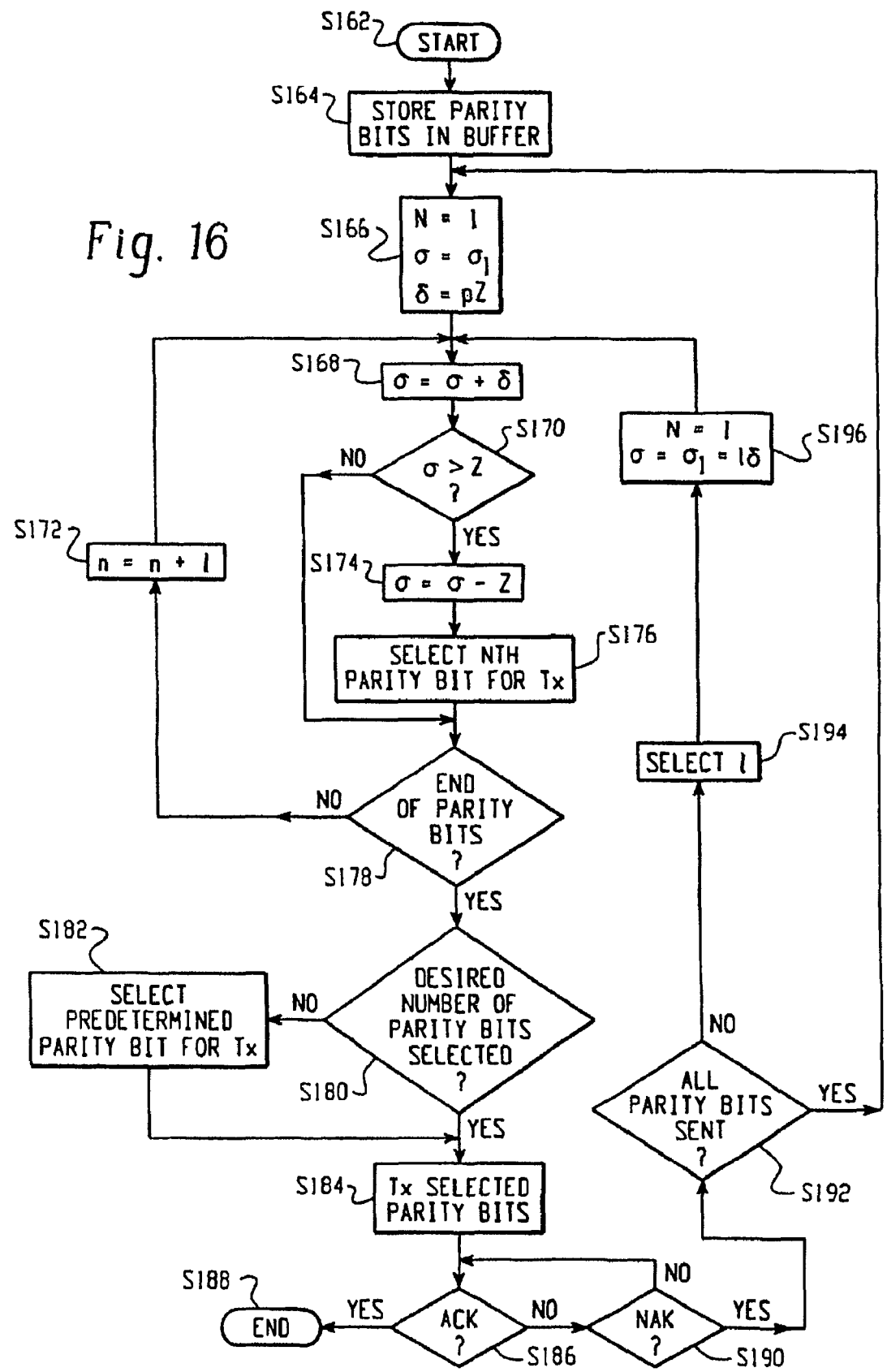
FIG. 16 is a flow diagram of a puncturing method in accordance with an embodiment of the invention.

The present invention is described, for example, with reference to FIG. 16. However, prior to describing the present invention in detail, some fundamental information useful in understanding the operation of the present invention is presented below. A detailed description of the present invention will follow thereafter.

In wireless communication channels, the presence of buildings, mountains, trees, and other obstacles can cause a transmitted signal to take several different paths of differing lengths to a receiver. The signals along these different paths can interfere with each other either constructively or destructively. Movement of either the transmitter or receiver can also contribute to this apparent amplitude fluctuation seen at the receiver. A channel with these characteristics is normally called a "multipath fading channel". The variation of the amplitude α of such a channel is often modeled using a Rayleigh probability density function, given by $$p(\alpha)=2\alpha\exp(-\alpha^2). \quad (1)$$

Additionally, additive white Gaussian noise (AWGN) is typically present in such a channel. This noise results from the combination of a wide variety of sources, including ambient heat in the transmitter and/or receiver, co-channel and adjacent channel interference, climatic phenomena and even cosmic background radiation. The AWGN n is modeled using a zero-mean Gaussian probability density with variance $\sigma^2$, given by $$p(n) = \frac{1}{\sigma\sqrt{2\pi}}\exp(-n^2/2\sigma^2). \quad (2)$$

Figure 1:
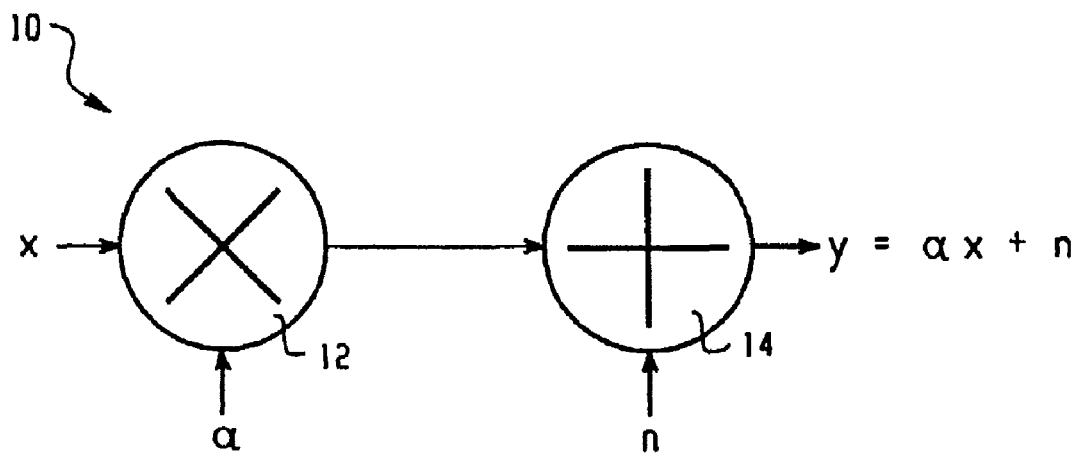
FIG. 1 is a conceptual model of a discrete memoryless channel.

FIG. 1 depicts the type of channel considered in this disclosure. It is a discrete, memoryless channel. A discrete channel is defined as a system consisting of an input alphabet X and output alphabet Y and a probability transition matrix p(x|y) that represents the probability of observing the output symbol y given that the symbol x is transmitted. The channel is said to be memoryless if the probability distribution of the output depends only on the input at that time and is conditionally independent of previous channel inputs or outputs. These assumptions are justified because most modern communication systems operate on the basis of discrete symbol values.

The channel input x here is an antipodal signal with equiprobable values of 1 and −1. The amplitude is scaled by the Rayleigh distributed α and then zero-mean white Gaussian noise is added to yield the channel output y, i.e. y=αx+n. In the case of an AWGN channel with no multipath fading component, the amplitude scaling value a is always equal to one.

There are many different mathematical models that are commonly used to describe fading channels. The particularly model used in the description below is a simplified model known as flat fading. In flat fading, it is assumed that the varying amplitude parameter α is constant for the duration of a symbol. It is to be noted that the invention is not restricted to flat fading channel environments. The flat fading conditions are assumed for illustrative puposes only and provide a common basis for comparing the performance of different embodiments of the invention and known HARQ systems and methods.

The throughput of hybrid ARQ schemes is strongly influenced by the power of the FEC used in the system. Recent advances in error control coding include the development of turbo codes. Turbo codes have been shown to achieve near-Shannon limit BER vs SNR performance. LDPC codes, originally developed by Gallager (see for example R. G. Gallager, "Low-Density Parity-Check Codes", *IRE Trans. on Inform.*

*Theory*, pp. 21-28, January 1962), also achieve near-Shannon-limit performance, and have recently been optimized to outperform turbo codes, particularly for long block lengths. The best turbo and LDPC code performance has been reported for long frame lengths, on the order of thousands of bits. For very short frame lengths, tail-biting convolutional codes tend to yield superior BER performance. However, for information frame lengths above 200 bits, turbo codes typically perform better, as shown for example in S. Crozier, A. Hunt, K. Gracie and J. Lodge, "Performance and Complexity Comparison of Block Turbo-Codes, Hyper-Codes and Tail-Biting Convolutional Codes," *Proc. 19th Biennial Queen's Symposium on Communications*, Kingston, ON, Canada, June 1998, pp. 84-88. Turbo and LDPC codes are described below.

Turbo codes were first introduced by Berrou, et al. in 1993 (C. Berrou, A. Glavieux and P. Thitimajshima, "Near Shannon Limit Error-Correcting Coding And Decoding: Turbo Codes", *Proc. IEEE Int. Conf. Commun., ICC '93*, Geneva, Switzerland, May 1993, pp. 1064-1070). Turbo codes use an encoder structure which consists of the parallel concatenation of multiple constituent encoders. A key feature of turbo codes is the presence of interleavers between the different constituent encoders.

As will be apparent to those skilled in the art to which the invention pertains, turbo codes are formed by the parallel concatenation of multiple recursive, systematic, convolutional codes. Pseudo-random interleaving is performed between parallel branches of the encoder. Turbo decoders use decoding blocks which implement a posteriori probability (APP) decoding using the forward-backward algorithm (FBA). Since there are multiple concatenated encoders, multiple APP decoding blocks are employed in an iterative feedback structure. Though the overall turbo decoding is sub-optimal, it still gives excellent performance.

Figure 2:
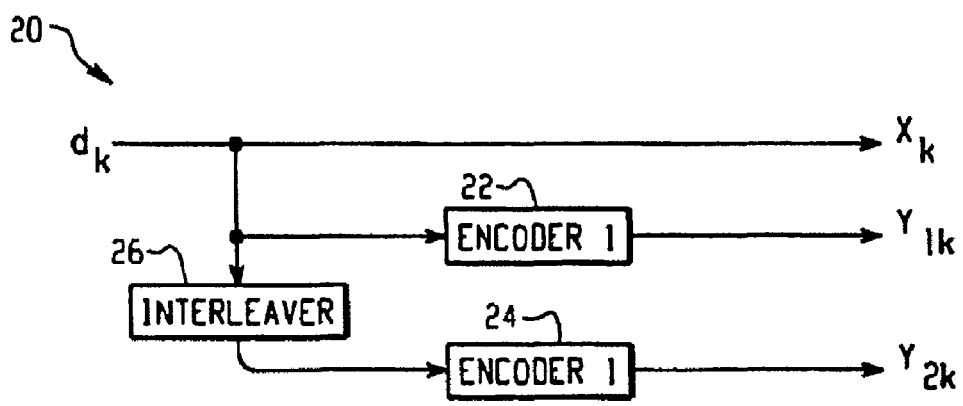
FIG. 2 is a block diagram of a parallel concatenated convolutional coder.

FIG. 2 shows a block diagram of the encoder of a turbo code. This is a parallel concatenated convolutional code (PCCC) structure. In this particular case, there are two constituent encoders 22 and 24 which are concatenated in parallel. Note that the input data is interleaved by interleaver 26 prior to being encoded by the second encoder 24. Interleaving involves reordering the elements within a frame of data. A more general turbo encoder could have more than two constituent encoders and more than one interleaver. The encoder structure of FIG. 2 is merely a non-limiting illustrative example encoder.

The different encoders 22 and 24 in the PCCC structure 20 typically implement the same constituent encoder. The turbo encoder 20 in FIG. 2 is a rate ⅓ encoder, with three output bits $X_k$, $Y_{1k}$ and $Y_{2k}$, for every input data bit $d_k$. The code rate could be increased to rate ½ by puncturing the outputs $Y_{1k}$ and $Y_{2k}$ of the two constituent encoders 22 and 24. This would reduce the channel symbol rate and bandwidth but would diminish the performance of the coding scheme.

Figure 3:
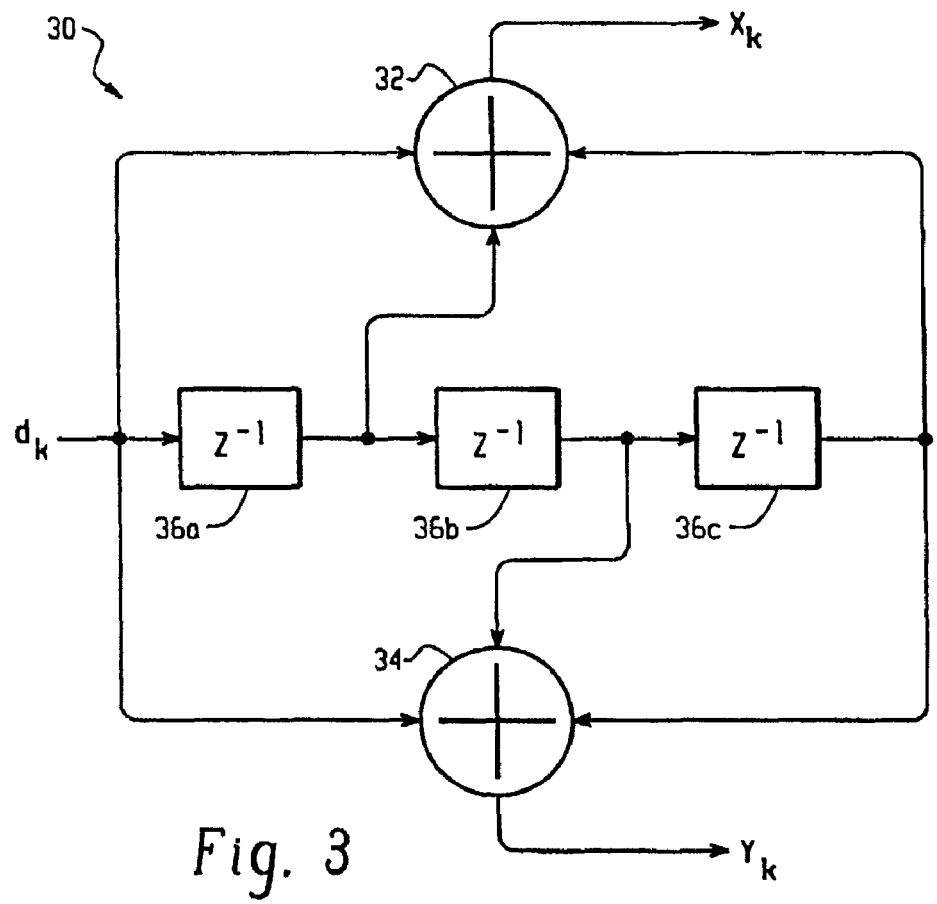
FIG. 3 shows a non-recursive, non-systematic convolutional encoder.
Figure 4:
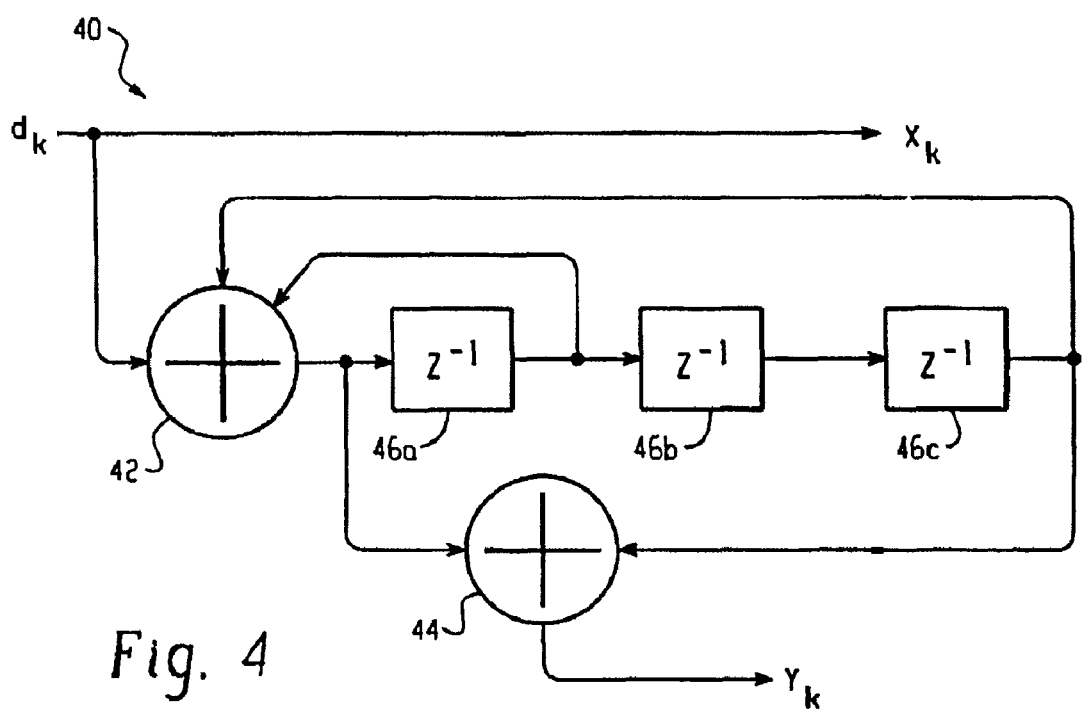
FIG. 4 is a recursive systematic convolutional encoder.

Convolutional encoders can be either systematic or non-systematic and recursive or non-recursive. In a systematic encoder, the input bits appear in the output data stream, whereas in a non-systematic encoder, they do not. Recursive encoders feed the output back to the input in a structure analogous to infinite impulse response (IIR) filters. In contrast, non-recursive encoders can be considered analogous to a finite impulse response (FIR) filter, where there is no feedback. The constituent encoder used in a turbo encoder implements a recursive, systematic convolutional (RSC) code. FIGS. 3 and 4 respectively show a non-recursive, non-systematic convolutional (NSC) encoder 30 and an RSC encoder 40, each comprising delay stages 36a-36c and 46a-46c and adders 32, 34, 42 and 44. The operation of such encoders will be apparent to those skilled in the art and as such will not be discussed in detail.

The BER of NSC codes is lower, i.e. better, than that of a systematic code with the same memory M at high SNRs. However, at low SNRs, the opposite is true. Turbo codes use RSC encoders. since RSC codes can perform better than the best NSC codes at any SNR for high code rates. Additionally, in the case of a frame of input data with weight 1 (i.e., only one bit is a 1, all the rest are 0), an NSC encoder output would have a weight of at most M. However, the output of the RSC code can potentially be of much higher weight, due to its IIR structure. The RSC encoder is very similar to a shift register based pseudo-random number generator, with the input data as a sort of initial seed. In this interpretation, we have two random number generators in the PCCC structure 20. The presence of the interleaver 26 ensures that the seeds for both random number generators is different. The fact that each random number generator has a different seed makes it very unlikely that the output of both encoders, and hence the codewords, are of low weight. The performance of a code is closely related to its minimum distance, which is the weight of its lowest weight codeword, excluding the all zeros codeword. This low probability of having low weight codewords is the reason for the excellent performance of turbo codes.

Figure 5:
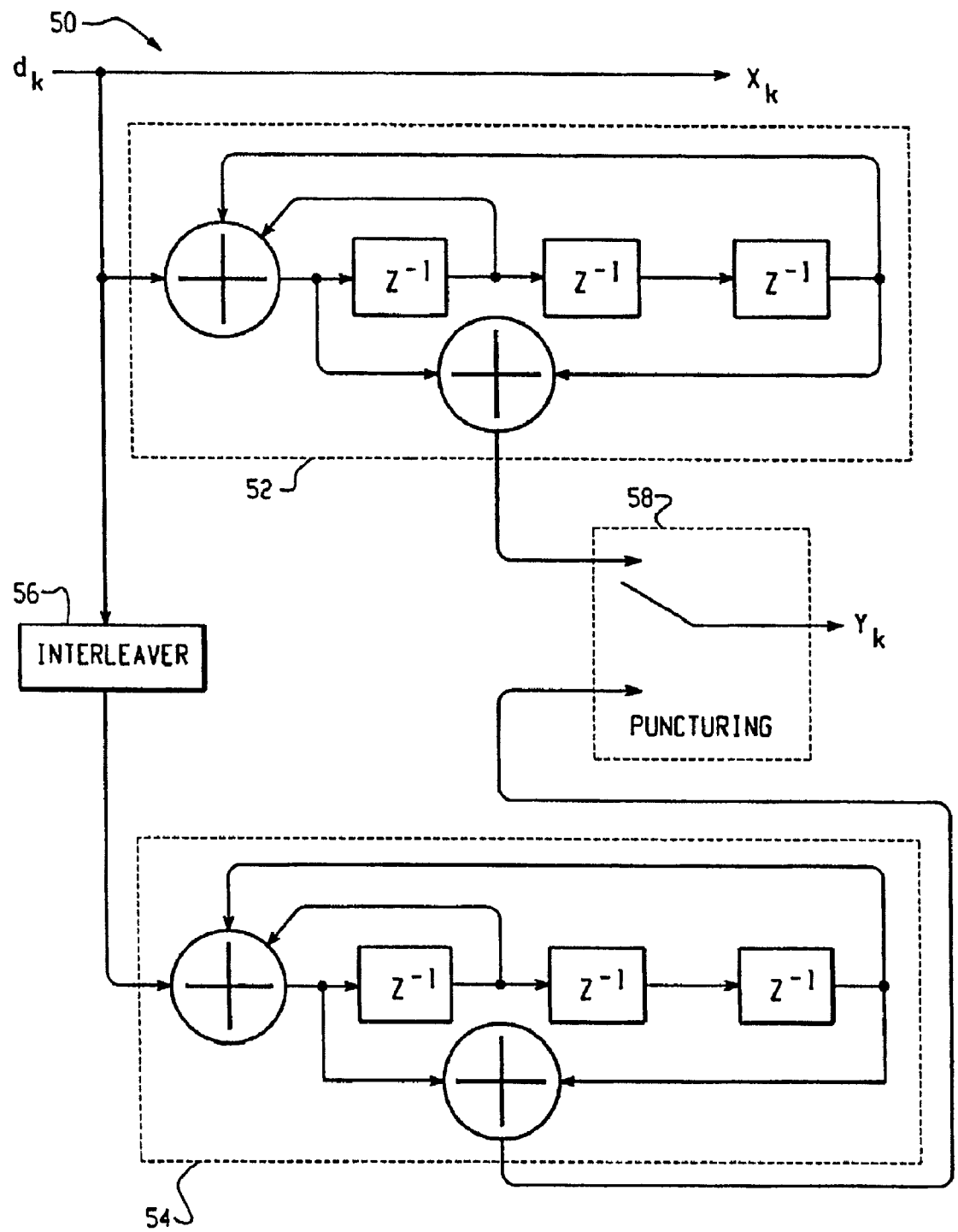
FIG. 5 shows a more detailed block diagram of a turbo coder similar to the coder 20 of FIG. 2.

FIG. 5 shows the parallel concatenation of two RSC coders as used in a typical turbo code. Turbo coder 50 is similar to coder 20 shown in FIG. 2, comprising two encoders 52 and 54 and an interleaver 56, but additionally implements a puncturing functional element 58.

The interleaver 26 or 56 is used in the error correcting capabilities of turbo codes. It has two functions. First, it improves the distance properties of the code words. The weight distribution for the code words resulting from the parallel concatenation of FIG. 5 for example depends on how the code words from one of the constituent encoders are combined with code words from the other encoder. As a basic rule, it is undesirable to combine low weight code words from one encoder with low weight code words from the other. It is the presence of the interleaver 56 that reduces the probability of this happening. An interleaver that permutes the data in some random way generally performs better than a matrix based interleaver. The second role of the interleaver in turbo codes is related to the iterative decoding which will be discussed later.

The turbo interleaver disclosed in the above paper by Berrou et al. writes input bits row by row into a square matrix. The reading process does not merely read out one column at a time as is common in known interleaver designs. Instead, when reading, the column index is a function of the row index. Let i and j be the addresses of row and column for writing, and let $i_r$ and $j_r$ be the addresses of row and column for reading. For an M×M memory (where M is a power of 2), i, j, $i_r$ and $j_r$ have values between 0 and M−1. Turbo interleaving may then be described by $$i_r = (M/2+1)(i+j) \bmod M, \quad (3)$$

$$\xi = (i+j) \bmod 8, \quad (4)$$

$$j_r = \{[P(\xi) \cdot (j+1)] - 1\} \bmod M, \quad (5)$$

where P(·) is a number, relatively prime with M, which is a function of line address (i+j) mod 8.

In a random interleaver, the position to which each element is mapped is randomly chosen from available remaining positions. Since it is random, it is possible that an element will be mapped to its original position. It is also possible that adjacent elements will remain adjacent after mapping. This is generally undesirable since it undermines the primary purposes of interleaving.

Spread interleavers are a special case of random interleavers where there are some additional constraints to the mapping. In particular, each randomly selected mapping integer is compared to the $S_1$ most recently selected integers. If the current selection is within a distance of $\pm S_2$ from one of the previous $S_1$ numbers, it is rejected and a new integer is randomly generated until the condition is satisfied.

Figure 6:
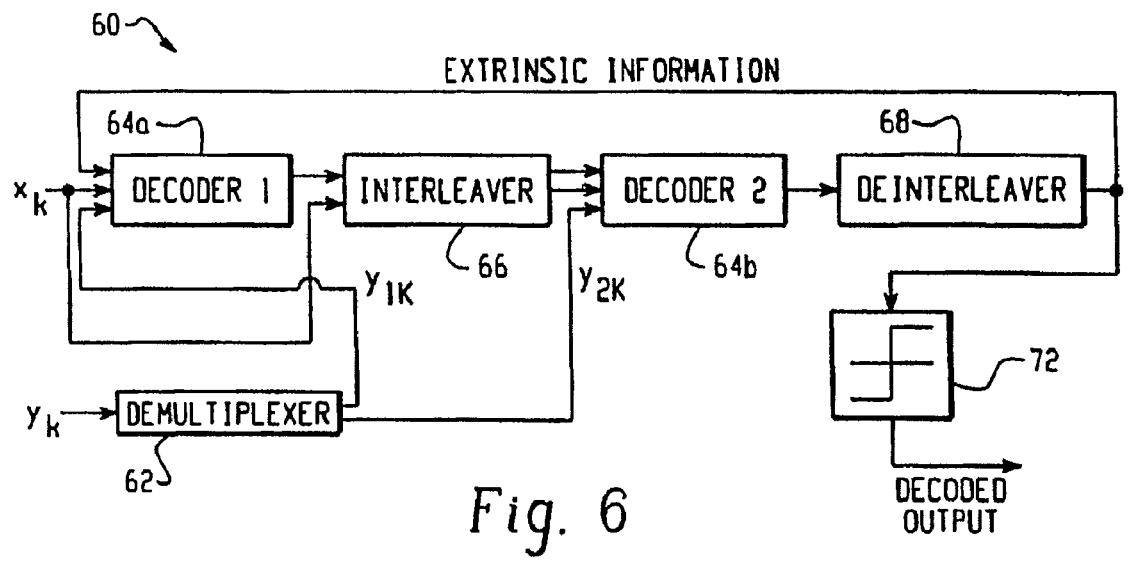
FIG. 6 is a block diagram of a turbo code decoder.

FIG. 6 shows the structure of the turbo decoder. The turbo decoder 60 contains a separate decoder 64a and 64b for each of the constituent encoders 22 and 24 or 52 and 54 in the PCCC structures 20 and 50. Each decoder has systematic and coded inputs, $x_k$ and $y_k$. In the case of a punctured encoder 50 as shown in FIG. 5, the demultiplexer 62 alternately sends the encoded values $Y_{1k}$ and $Y_{2k}$ to decoders 64a and 64b. Erasures pad the data between demultiplexing intervals. The output of the first decoder 64a is interleaved in interleaver 66 and used as the systematic input to the second decoder 64b. The interleaver permutations in the decoder are the same as those used in the encoder and the deinterleaver 68 applies a reversal of the interleaving process.

The output of the second decoder 64b is fed back to the first decoder 64a. Thus, decoding is an iterative process with data feedback on each iteration. The data fed back to the first encoder 64a is known as extrinsic information. Extrinsic information represents knowledge gained from the decoding process. After some number of iterations, the output of the second decoder 64b is de-interleaved and passed to a slicer 72 to yield final hard decisions. Both the systematic and extrinsic inputs to the first decoder 64a are corrupted by noise, which ideally is uncorrelated. Additionally, the first decoder 64a should not be fed back information that stems from itself, in order to avoid high input and output correlation. If the average spreading effect of the interleaver 66 is large, which is desired as discussed above, then the correlation between the noise on the extrinsic feedback information and systematic data entering the first decoder 64a will be low. This allows them to be jointly used for decoding, which results in improved performance of turbo codes.

The feedback structure requires that the decoders 64a and 64b output soft reliability values, not hard decisions. Therefore, the Viterbi maximum likelihood sequence detection algorithm commonly used to decode convolutionally coded data is inappropriate. The forward-backward algorithm (FBA), which estimates the a posteriori probability (APP) or soft decision for each decoded bit, is instead used for decoders 64a and 64b. Like the Viterbi algorithm (VA), the FBA exploits the trellis structure of convolutional codes. The FBA is analogous to computing the VA in two directions over a block of coded bits. Metrics are associated with each state in both the forward and backward directions. These metrics are then used to generate the soft APP for each bit. Because it involves both forward and backward computations, the complexity of the FBA is approximately twice that of the VA when decoding a code with the same M. The FBA also requires several times the memory storage of the VA.

The FBA was proposed in the above paper by Berrou et al. for use in the turbo decoder. One significant drawback of the FBA is its high complexity and memory requirements. Other sub-optimal though less complex soft decision algorithms, such as the Soft Output Viterbi Algorithm (SOVA) described for example in J. Hagenauer and P. Hoeher, "A Viterbi Algorithm with Soft-Decision Outputs and its Applications", *Proc. of IEEE GLOBECOM '89*, Dallas, Tex., pp. 47.1.1-47.1.7., November 1989, could also be used. Reducing the complexity of the decoding algorithm is important because a turbo decoder will typically iterate between 6 and 18 times before generating a final hard decision.

LDPC codes are linear block codes with very sparse parity check matrices. In Gallager's original construction, the parity check matrix has a small, fixed number of ones per row and a small, fixed number of ones per column. Such codes are referred to as regular LDPC codes. All LDPC codes can be represented in the form of a factor graph. Such a factor graph has two types of nodes, commonly referred to as variable nodes, which represent bits in the codeword, and function nodes, which represent parity check equations that must be satisfied by a valid codeword. An iterative algorithm that passes messages back and forth between the two types of nodes in the factor graph is used to decode LDPC codes.

Sparse parity-check matrices such as those characterizing LDPC codes contain mostly 0's, with only a small number of 1's. In a regular (n, j, k) LDPC code, the parity check matrix has n columns with a small, fixed number, j, of 1's and rows with a small, fixed number, k, of 1's. It is the sparse nature of the parity-check matrix that allows for tractable, iterative decoding of LDPC codes.

Recently, irregular LDPC codes which outperform regular LDPC codes have been developed. Irregular LDPC codes also have sparse parity check matrices, but unlike regular LDPC codes, the number of 1's per row and column is not fixed. One known irregular LDPC code is described by two polynomials, the variable degree sequence $\lambda(x)$ and the check degree sequence $\rho(x)$, where $$\lambda(x) = \sum_{i=1}^{d_l} \lambda_i x^{i-1}, \qquad (6)$$

$$\rho(x) = \sum_{i=1}^{d_l} \rho_i x^{i-1}, \qquad (7)$$

and $\lambda_i$ and $\rho_i$ are respectively the fractions of edges emanating from variable and check nodes of degree i. A technique is also known to determine a threshold value $\sigma^*$ associated with any irregular LDPC code defined by its degree sequences. This threshold value is used as a measure of code performance. Degree sequences which yield good threshold values can be selected to generate codes for a variety of code rates and channels.

Such binary linear codes as LDPC codes can be represented in the form of a factor graph. A factor graph is a bipartite graph that expresses how a "global" function of many variables factors into a product of "local" functions. As mentioned above, a factor graph includes variable nodes and function nodes. Each function node represents one of the local functions and is connected to only those variable nodes that are arguments of the function.

In the case of a binary linear code, each local function is an indicator for a parity check equation of the code that corresponds to a row in the parity check matrix H. For example, consider the (7,4) Hamming code defined by the parity check matrix $$H = \begin{bmatrix} 1 & 0 & 1 & 1 & 1 & 0 & 0 \\ 1 & 1 & 0 & 1 & 0 & 1 & 0 \\ 0 & 1 & 1 & 1 & 0 & 0 & 0 \end{bmatrix}. \qquad (8)$$

Figure 7:
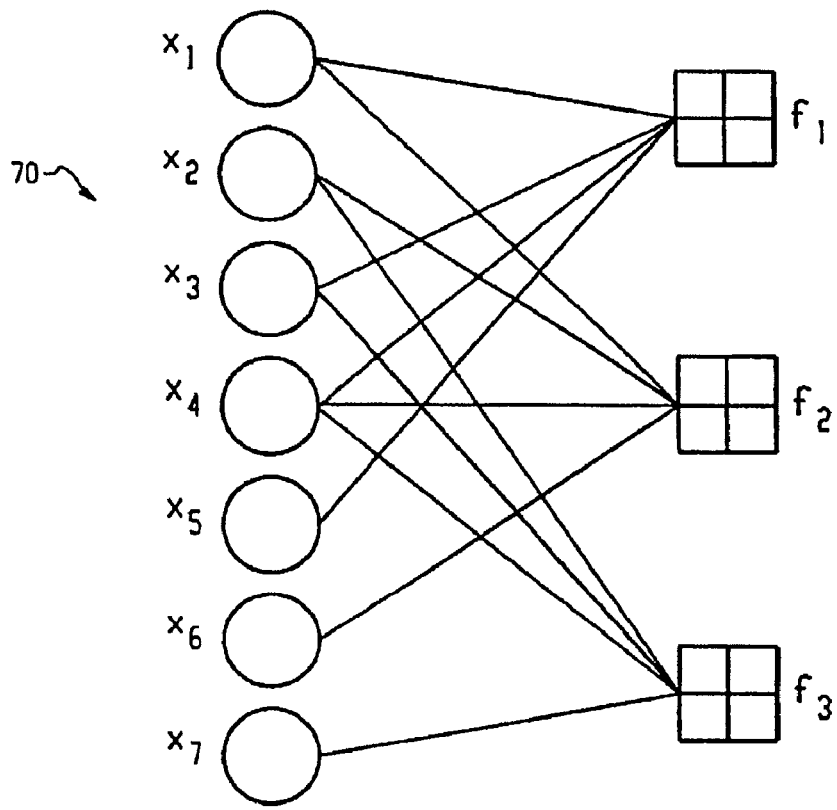
FIG. 7 shows a factor graph for a (7, 4) Hamming code.

This code consists of all binary 7-tuples $\hat{x} = (x_1, x_2, \ldots, x_7)$ satisfying $Hx^T = 0$. Each row of H represents one equation that must be satisfied by x. The factor graph corresponding to this (7,4) code is shown in FIG. 7.

The variables $x_1, x_2, \ldots, x_7$ in the factor graph 70 are also referred to as sites while the functions $f_1$, $f_2$ and $f_3$ are also referred to as checks. In regular LDPC codes, all variable nodes have the same degree j while the check nodes have the same degree k. In irregular LDPC codes, the degree of different variable or check nodes can differ.

Iterative decoding of original Gallager LDPC codes is described in the Gallager article referenced above and in D. J. C. MacKay, "Good Error-Correcting Codes Based on Very Sparse Matrices", *IEEE Trans. on Inform. Theory*, vol. 45, pp. 399-431, March 1999. The decoding algorithm described by Gallager uses hard decisions and involves a process of iteratively flipping bits until the parity check equations are satisfied. MacKay describes the decoding in terms of belief propagation, which can be viewed as an instance of the known sum-product algorithm.

The process of decoding LDPC codes involves passing messages along the edges of the factor graph. There are two types of messages associated with the factor graph representation of an LDPC code, site-to-check (S-C) messages and check-to-site (C-S) messages. One of each type of message is associated with every edge of the factor graph.

The standard notation for the C-S message on a given edge is $u_{f_i \to x_l}(z)$, where $f_i$ is the i-th parity check equation, $x_l$ is the l-th site, and z is either 0 or 1, since there are two actual values associated with each binary message. The two different values, $u_{f_i \to x_l}(0)$ and $u_{f_i \to x_l}(1)$ correspond to the two different possible values of the bit associated with the symbol $x_l$. The notation for the S-C message on a given edge is similar, $u_{x_l \to f_i}(z)$. There is a C-S message and an S-C message associated with every edge of a factor graph. In alternate implementations, the two values of each message (z=0 and z=1) could be represented as a single value through the use of likelihood ratios or differences.

Assuming a received sequence $y = (y_1, y_2, \ldots, y_n)$ at a channel output, a transmitted codeword of $x = (x_1, x_2, \ldots, x_n)$ and a channel noise sequence of n, y=x+n. For each received symbol y, the function f(y|x) can be computed. Assuming that the channel is as shown in FIG. 1 and described above and the receiver has perfect channel state information (CSI) and thus knowledge of $\alpha$, the channel likelihoods are given by:

$$p(y \mid x = -1, \alpha) = \frac{1}{\sigma\sqrt{2\pi}} \exp(-(y+\alpha)^2/2\sigma^2), \text{ and} \qquad (9)$$

$$p(y \mid x = 1, \alpha) = \frac{1}{\sigma\sqrt{2\pi}} \exp(-(y-\alpha)^2/2\sigma^2), \qquad (10)$$

where the transmitted symbol x=−1 is associated with the information bit value 0 and x=1 is associated with the bit value 1. These probabilities are then normalized to get the probabilities of the bits associated with each symbol, $P_x(0)$ and $P_x(1)$.

According to the sum-product algorithm update rule, the message sent from a node v on an edge e is the product of the local function at v (or the unit function if v is a variable node) with all the messages received at v on the edges other than e, summarized for the variable associated with e. The process of computing the message is different for the two cases of the node being either a variable node (S-C message) or a function node (C-S message).

In accordance with an aspect of the invention, the channel likelihoods are computed for every received symbol according to the expressions given in (1) and (2). All S-C messages are initialized to the channel probabilities associated with the site from which they emanate. This means that all S-C messages emanating from a given site have the same initial value.

Figure 8:
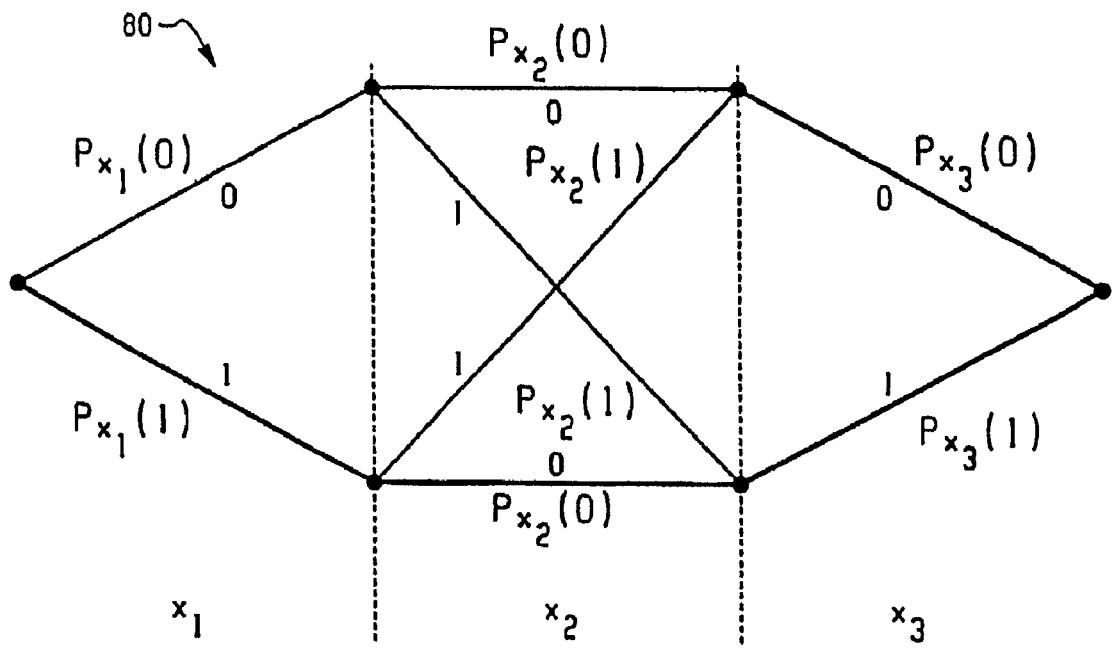
FIG. 8 is a trellis diagram corresponding to an example parity check equation, useful in understanding the decoding of LDPC codes.

The C-S messages are then computed. For each check node, the C-S messages are a function of the incident S-C messages and are computed using the FBA as described below. Consider a parity check equations $f_1$ in which the variables $x_1$, $x_2$, $x_3$ appear. Assuming that the values for all S-C messages have been computed or are otherwise available, the C-S messages associated with this example parity check equation ($u_{f_1 \to x_1}(z)$, $u_{f_1 \to x_2}(z)$ and $u_{f_1 \to x_3}(z)$) can be computed. FIG. 8 shows a trellis diagram associated with the example equation $f_1$.

Each stage in this trellis 80 represents one of the three sites that participate in this particular example parity check equation. The sparse nature of LDPC matrices ensures that any trellis always has a small number of sections. The nodes in this trellis represent points where parity is satisfied, while edges represent possible bits associated with the symbol corresponding to the particular stage of the trellis in which the edge is located. Note that there is no temporal interpretation of this trellis representation. In contrast, the trellis on which the FBA operates in the decoding of turbo codes does have a temporal interpretation. Each edge also has a corresponding S-C message, shown in FIG. 8 and subsequent Figures as $P_{x_i}(z)$ messages, corresponding to but simpler than the above $u_{f_i \to x_i}(z)$ notation. Any possible path between the nodes on either side of the trellis represents a possible bit combination associated with ($x_1$, $x_2$, $x_3$) which satisfies parity.

The forward values $\alpha$ associated with the trellis are first computed. It will be apparent to those skilled in the art that this $\alpha$ associated with the trellis is not the amplitude variation factor $\alpha$ in the above Rayleigh fading channel model. There are two values, $\alpha_0[n]$ and $\alpha_1[n]$ for each stage of the trellis where n is an element of E, the variable index set containing the indices of the sites involved in the parity check equation. In our example, E={1, 2, 3}. We move from left to right (forward) in the trellis 80 as the values of $\alpha$ are calculated. The values of $\alpha$ for the leftmost stage, $\alpha_0[1]$ and $\alpha_1[1]$ are set to 1 and 0 respectively. The subsequent values are given by:

$$\alpha_0[n] = \alpha_0[n-1]u_{x_{n-1} \to f_1}(0) + \alpha_1[n-1]u_{x_{n-1} \to f_1}(1) = \alpha_0[n-1]P_{x_{n-1}}(0) + \alpha_1[n-1]P_{x_{n-1}}(1), \text{ and} \quad (11)$$

$$\alpha_1[n] = \alpha_0[n-1]u_{x_{n-1} \to f_1}(1) + \alpha_1[n-1]u_{x_{n-1} \to f_1}(0) = \alpha_0[n-1]P_{x_{n-1}}(1) + \alpha_1[n-1]P_{x_{n-1}}(0). \quad (12)$$

Figure 9:
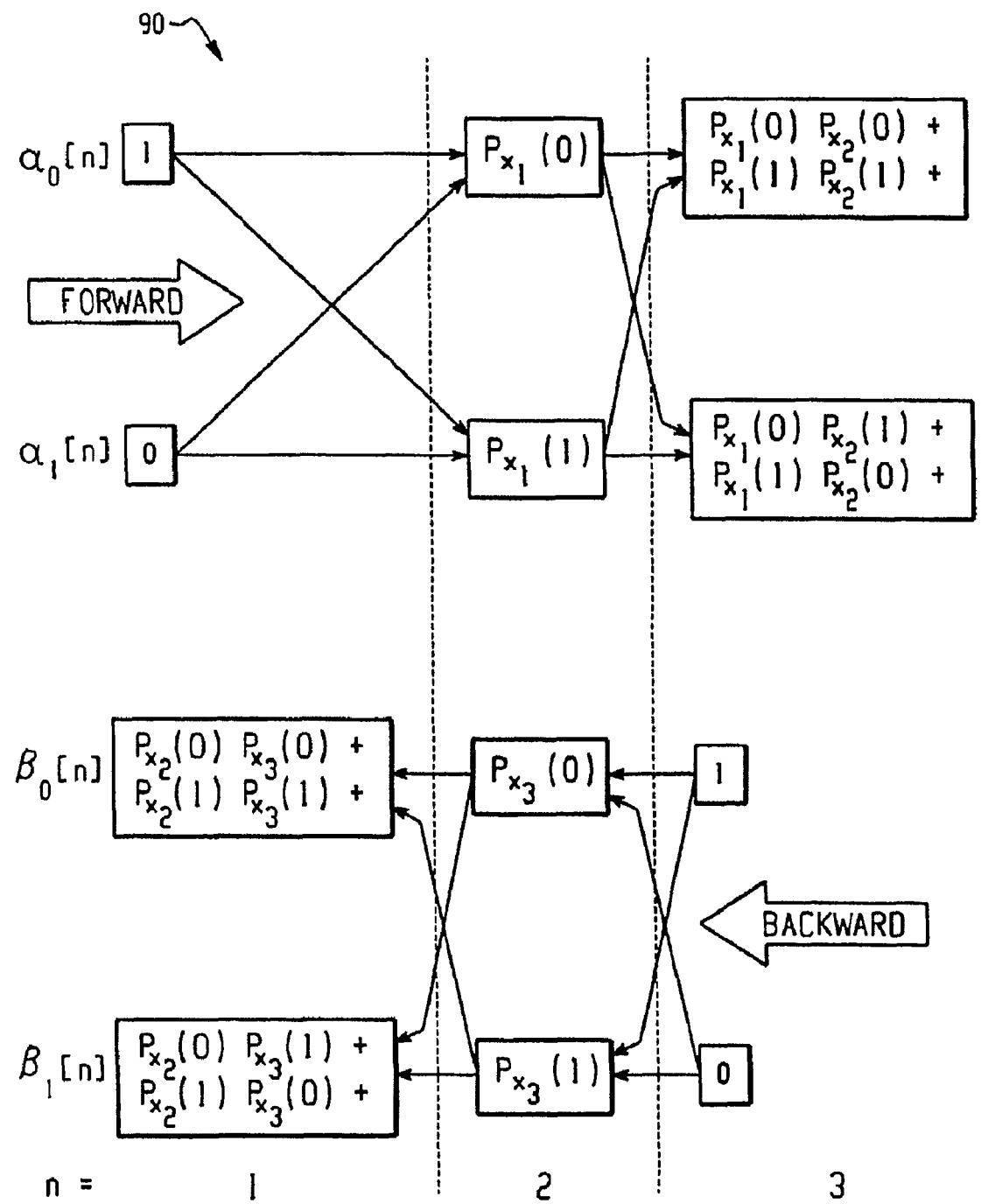
FIG. 9 illustrates forward-backward algorithm (FBA) decoding of the example LDPC code represented by the trellis diagram in FIG. 8.

FIG. 9 shows the values for $\alpha$ at every stage in the trellis for our example. There are also two values, $\beta_0$ and $\beta_1$ for each stage of the trellis 90. These values are computed from right to left, or backward. The rightmost values, $\beta_0[3]$ and $\beta_1[3]$ in our example, are initialized to 1 and 0 respectively. The remaining values are calculated according to:

$$\beta_0[n] = \beta_0[n+1]u_{x_{n+1} \to f_1}(0) + \beta_1[n+1]u_{x_{n+1} \to f_1}(1) = \beta_0[n+1]P_{x_{n+1}}(0) + \beta_1[n+1]P_{x_{n+1}}(1), \quad (13)$$

and $$\beta_1[n] = u_{x_{n+1} \to f_1}(1) + \beta_1[n+1]u_{x_{n+1} \to f_1}(0) = \beta_0[n+1]P_{x_{n+1}}(1) + \beta_1[n+1]P_{x_{n+1}}(0). \quad (14)$$

FIG. 9 also shows the values for $\beta$ for every stage of the trellis for our example. When all the values of $\alpha$ and $\beta$ have been calculated, the C-S message from the check $f_i$ to the site $x_n$, where n∈E and E is the variable index set for $f_i$, is given by:

$$u_{f_i \to x_n}(0) = \alpha_0[n]\beta_0[n] + \alpha_1[n]\beta_1[n], \text{ and} \quad (15)$$

$$u_{f_i \to x_n}(1) = \alpha_0[n]\beta_1[n] + \alpha_1[n]\beta_0[n]. \quad (16)$$

Using this FBA method, all C-S messages for a check node can be computed. The same procedure is applied for all the check nodes. As long as all C-S messages are computed, the order of their computation is unimportant.

Computing the S-C messages is relatively simple. The S-C message $u_{x_i \to f_i}(z)$ is given by:

$$u_{x_i \to f_i}(z) = \prod_{n \in E \setminus i} u_{f_n \to x_i}(z). \quad (17)$$

Here, E is the check index set for the site $x_i$. In the above example (7,4) Hamming code represented by the factor graph in FIG. 7, for $x_1$, E={1, 2} and for $x_4$, E={1, 2, 3}. The notation n∈E\i in (17) indicates that n is indexed over all elements of E except element i. The S-C message for an edge is simply the product of all the C-S messages incident on the variable node except the C-S message on the edge in question. As in the C-S message case, the order of computation of S-C messages is unimportant, as long as they are all computed.

Each time the C-S and S-C messages have been computed, one iteration of the decoding algorithm is completed. After a number of iterations, the algorithm terminates. The process of termination involves computing the pseudo-APP for each input bit. The pseudo-APP is determined from the S-C messages. In particular, each input bit's pseudo-APP is given by:

$$P_{x_i}(z) = \prod_{n \in E} u_{f_n \to x_i}(z). \quad (18)$$

As above, E is the check index set associated with the site. For each bit, the final hard decision is obtained by comparing the probability of the bit being a 0 ($P_{x_i}(0)$) with the probability of the bit being a 1 ($P_{x_i}(1)$) and selecting the choice with higher probability.

The performance of the LDPC decoder improves as the number of iterations increases. However, early termination can help minimize the decoding complexity. In order to allow for such early termination, the hard decisions described in the preceding paragraph are obtained after each iteration. The decoder can either compute the syndrome vector (multiply the hard decision vector x by the parity check matrix H) and check if it is all-zeros, or use some other error detection technique, to determine if these hard decisions are in error. If they are not, the decoder can terminate early. Otherwise, it will compute the maximum number of iterations before generating hard decisions.

ARQ protocols will now be considered. As discussed briefly above, ARQ protocols are used when a feedback channel is available. The feedback channel provides a means for a receiver to inform a transmitter of the success or failure of a transmission. ARQ protocols can be divided into two categories, pure ARQ and hybrid ARQ. Pure ARQ protocols only use coding for error detection and achieve virtually error-free performance only through repeated retransmission of frames, whereas hybrid ARQ protocols achieve superior throughput performance by incorporating the error-correcting power of FEC.

A requirement in either ARQ system is error detection. The receiver should have highly reliable error detection capabilities in order to know whether to accept or reject a frame. The FEC schemes discussed above are intended to correct, not detect, errors. However, other types of codes exist with powerful error detecting capabilities.

In particular, cyclic codes are often used for error detection. Cyclic codes offer many advantages for error detection. Their encoders and decoders can be implemented with simple shift register circuits and a single encoder-decoder pair can be used with data of different frame lengths. Some CRC codes that are often used in communications systems and are incorporated into several communications standards use 16-bit and 32-bit CRC fields. A particular 16-bit CRC sequence used in the CRC-ANSI standard can be used for error detection for block lengths of up to k=32767 bits.

The throughput performance of an ARQ protocol is a strong function of how retransmission requests are handled by the transmitter and receiver. Typically, there is a trade-off between system complexity (memory requirements and computational complexity) and performance. There are three standard pure ARQ protocols, stop and wait (SW-ARQ), go-back-N (GBN-ARQ) and selective repeat (SR-ARQ).

In SW-ARQ, the transmitter sends out a frame and waits in an idle state until it receives an ACK before sending out the next frame. In the event that a NAK is received, the last frame is retransmitted. This avoids the need for more than one frame of memory in either the transmitter or the receiver. However, the fact that the transmitter is idle for some time reduces throughput. The transmitter is idle for at least the forward and backward propagation time of the signal and in systems with long propagation delays, such as geostationary satellite communications, throughput can be very low.

In GBN-ARQ, the transmitter sends frames continuously. When a receiver detects an error, it sends a NAK and stops until it receives the error frame again. While waiting, it ignores all other incoming frames. This means that no buffering is required in the receiver. However, the transmitter must retransmit the error frame, plus all subsequent frames it has transmitted up to the point when it received the NAK. This means that transmitter buffering is necessary. The throughput of SW-ARQ and GBN-ARQ systems is a function of the forward and backward propagation delays and the receiver processing delay.

SR-ARQ systems require buffering at both the transmitter and receiver. As in GBN-ARQ, the transmitter sends a continuous stream of frames. If a retransmission request occurs, it stops and retransmits the requested frame. It then returns to where it stopped and resumes transmission of new frames. This means that each NAK results in only one frame being retransmitted. In this case, the throughput is independent of any system delay. In fact, the throughput of an SR-ARQ system is only a function of the FER of received frames. By incorporating a powerful FEC, a hybrid ARQ system can exhibit increased throughput by reducing FER.

The key performance measure in any ARQ system is throughput. The throughput of an SR-ARQ scheme is defined as the ratio of the length of an information frame k to the average total number of bits, $N_{av}$, that must be transmitted in order for the information frame to be accepted by the receiver. This total number of bits consists of the information bits, the error detecting CRC bits and any necessary parity bits. The throughput η is given by $$\eta = \frac{k}{N_{av}}. \quad (19)$$

Throughput is a measure of transmission efficiency and has a maximum possible value of 1. In an ARQ system, this maximum possible throughput cannot be achieved since, at a minimum, the error detecting CRC bits must be transmitted in addition to the information bits. However, since the number of CRC bits is typically much smaller than the information frame length k, a maximum throughput that is very close to 1 is possible.

Figure 10:
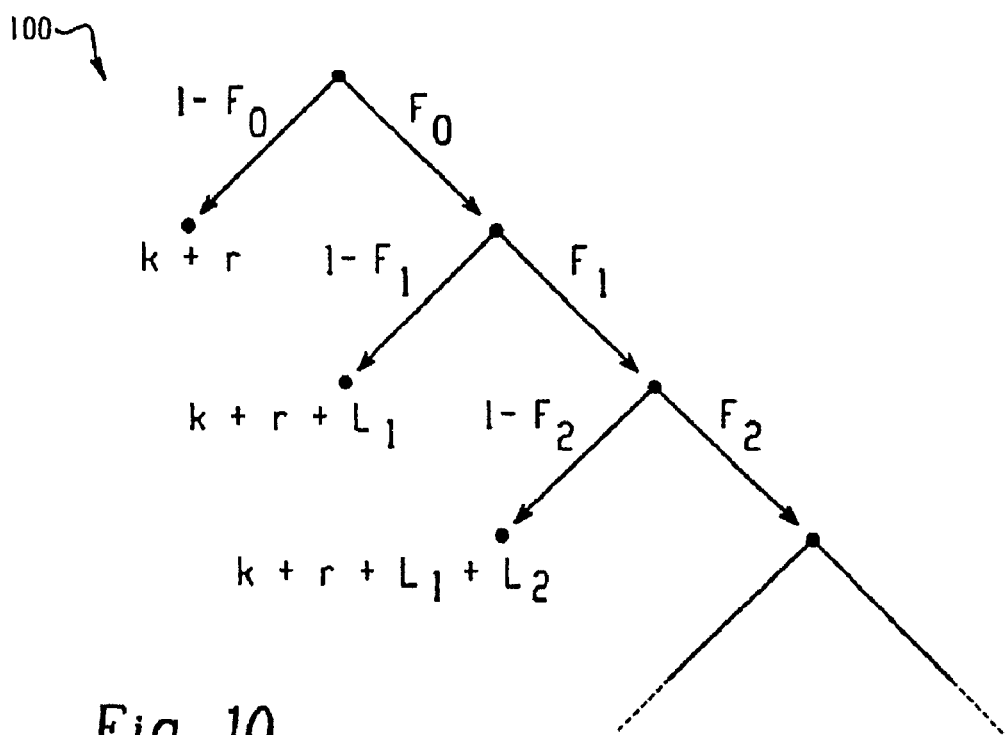
FIG. 10 shows a graphical representation of HARQ system throughput.

In a type-II hybrid ARQ system, $N_{av}$ is given by $$N_{av} = \sum_{i=0}^{\infty} N_i p_i, \quad (20)$$

where $N_i$ is the total number of bits transmitted after the ith transmission and $p_i$ is the probability of the receiver accepting the frame after the ith transmission. These two factors are given by:

$$p_i = (1 - F_i) \prod_{j=0}^{i-1} F_j \text{ and} \quad (21)$$

$$N_i = k + r + \sum_{j=0}^{i} L_j, \quad (22)$$

where $F_i$ is the frame error rate after the ith transmission, $L_i$ is the length of the ith transmitted parity frame $P_i$, k is the length of the information bit frame and r is the number of error-detecting CRC bits. Since only the information and CRC bits are initially transmitted, $L_0=0$. This throughput analysis is graphically depicted in FIG. 10, in which the values at the left side nodes represent the different possible values of $N_i$, while the product of the edge values from the root node to a particular left node represents the probability $p_i$.

Clearly, $\eta_{max}=k/(k+r)$ is the best possible throughput that can be achieved, and only under the condition of $F_0=0$. An important system consideration is the size of the parity increments, $L_i$. The above throughput analysis implies that η is maximized when $L_i=1$, its minimum possible value. However, practical implementation issues dictate that this length be greater than 1. The throughput penalty related to longer parity increment lengths will become apparent from the following description.

Typical hybrid ARQ schemes based on turbo and LDPC codes fall into one of two categories: punctured systems and concatenated systems. Both such systems are based on the HARQ techniques of incremental parity and code combining, which have been used successfully with less powerful codes, as discussed above. In each case, the systematic bits and the CRC bits are sent initially. In the event of a NAK, some quantity of parity bits is sent. A receiving decoder then attempts to use these parity bits along with the previously sent bits to correctly decode the systematic data. This continues with each NAK until the CRC check is finally passed and an ACK is sent.

Note that the decoder uses all the previously sent parity bits, not just the most recently sent ones, to decode the systematic bits. Thus as more and more parity bits are sent, the effective code rate steadily decreases and the error correction capability of the decoder increases. With a more powerful decoder, the FER decreases, which as also discussed above, increases throughput.

In a punctured system, the parity bits for a systematic, low rate "mother code" are first generated in a transmitter. The decoding complexity associated with such a punctured system is always equal to the complexity of decoding the low rate mother code. This is true even when the effective code rate is still high. According to a HARQ protocol, in the first transmission, only the systematic and CRC bits are sent. In the event of a NAK from a receiver, the mother code is punctured to some higher rate and the unpunctured parity bits are transmitted, while the punctured bits are retained. A decoder in the receiver, using erasures in place of the punctured bits, attempts to decode. If unsuccessful, the receiver sends another NAK, and in response thereto some of the retained punctured bits are transmitted by the transmitter. This process continues until all the parity bits have been transmitted. This implies that the rate of the mother code is the minimum rate that can be achieved. If the CRC fails at this point, the process would start again, with the systematic and CRC bits being transmitted etc. However, in this case, the received soft channel outputs corresponding to retransmitted frames (systematic bits and subsequent parity bits) are combined with their corresponding originally transmitted version. This increases the effective SNR at the receiver.

Figure 11B:
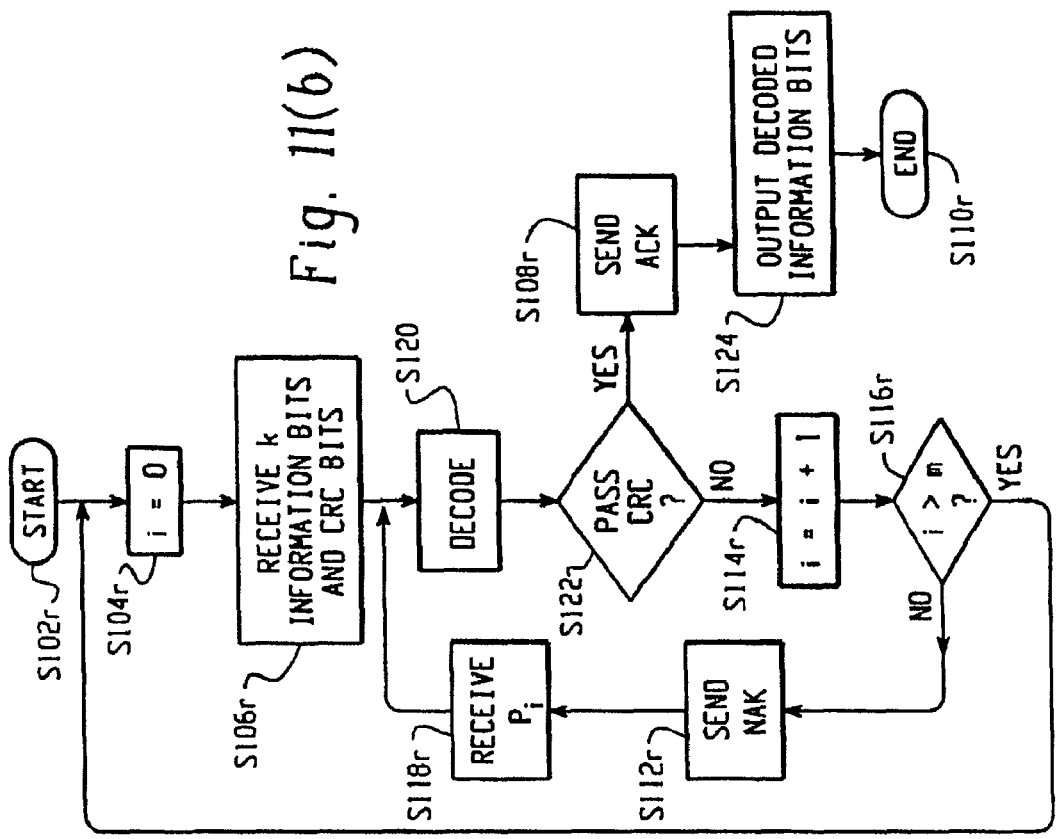
FIGS. 11($a$) and 11($b$) are flow diagrams illustrating the operation of a punctured HARQ communication system.
Figure 11A:
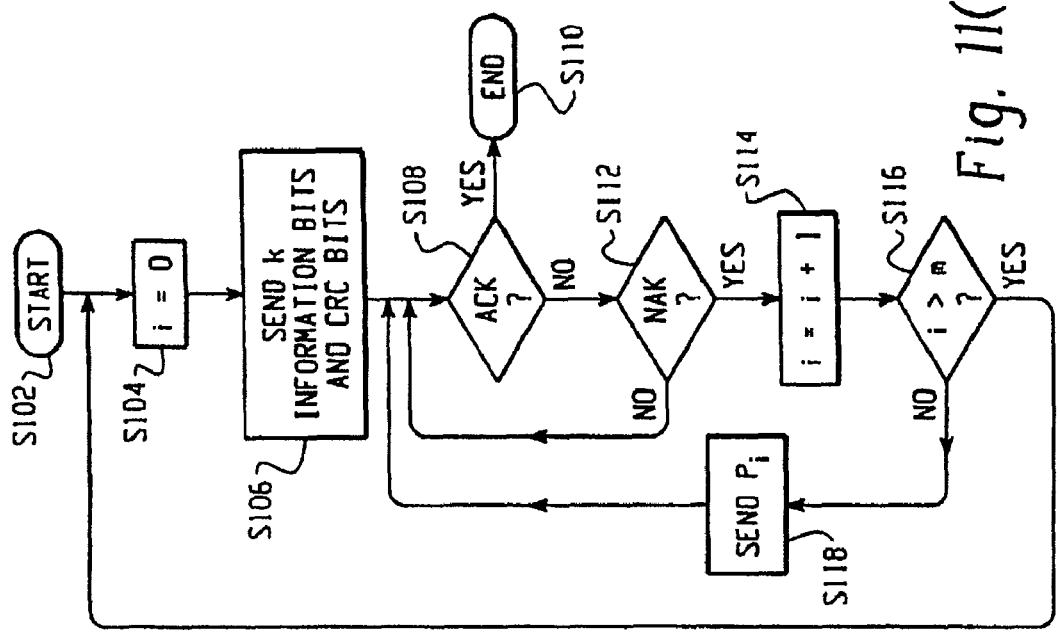

FIGS. 11(a) and 11(b) show the typical operations in a punctured hybrid-ARQ system, FIG. 11(a) representing operations at the transmitter side and FIG. 11(b) representing receiver side operations. At a transmitting end, a punctured HARQ protocol starts as indicated at step S102, and a parity increment index i is initialized to 0 at a step S104. At a step S106, an initial frame of length k, comprising information bits and CRC bits, is transmitted. The transmitter then awaits either an ACK (S108), indicating that the transmitted frame was received properly by the intended receiver, and the HARQ process ends (S110), or a NAK (S112). If a NAK is received, the parity increment index i is incremented by one at step S114. Provided that i is less than or equal to the maximum number of retransmissions m (S116), the transmitter transmits an $i^{th}$ parity block $P_i$ (S118). Steps S108, S112, S114, S116 and S118 are then repeated until either an ACK is received at step S108, in which case the process ends (S110), or the maximum number of retransmissions have been performed. When i is determined to be equal to m at step S116, all parity bits have been transmitted and the entire process is repeated.

At a receiver end, the operations shown in FIG. 11(b) will be performed. In FIG. 11(b), method steps related to those in FIG. 11(a) have been similarly labelled, but include the suffix "r". As shown in FIG. 11(b) the receiver HARQ protocol begins at a step S102r and the parity increment index i is initialized to 0 at step S104r, as in the transmitter. The frame of length k transmitted by the transmitter is then received (S106r) and decoded (S120) at the receiver and a CRC check is performed (S122). If the decoded frame passes the CRC check, then an ACK is sent from the receiver to the transmitter at step S108r, the decoded information bits are output at step S124, and the receiver process ends at step S110r. If not, then the parity increment index i is incremented by 1, at step S114r. Unless i is greater than the maximum number of retransmissions m (S116r), a NAK is sent from the receiver to the transmitter (S112r). The $i^{th}$ parity block $P_i$ transmitted by the transmitter at step S122 in FIG. 11(a) is received by the receiver at step S118r. The decoding, CRC checking and incremental parity reception steps are then repeated. As discussed above in relation to FIG. 11(a), all of the parity bits have been transmitted after m retransmissions. At this point, if the frame has still not been decoded properly, the entire process is repeated.

Typically in any punctured system, a low rate mother code may be selected. In accordance with an aspect of the invention, this code could be a turbo code or an LDPC code. In the case of turbo codes, a preferred minimum rate is ⅓, unless a multiple turbo code is used. There is no minimum rate for LDPC codes, although LDPC code performance diminishes as the rate decreases. In either case, an issue is how to puncture the mother code. The performance of candidate mother codes with different amounts of puncturing must be assessed. It is known that both turbo codes and LDPC codes perform very close to channel capacity. The key issue in any punctured HARQ system using these codes is how well they perform when punctured.

Figure 12B:
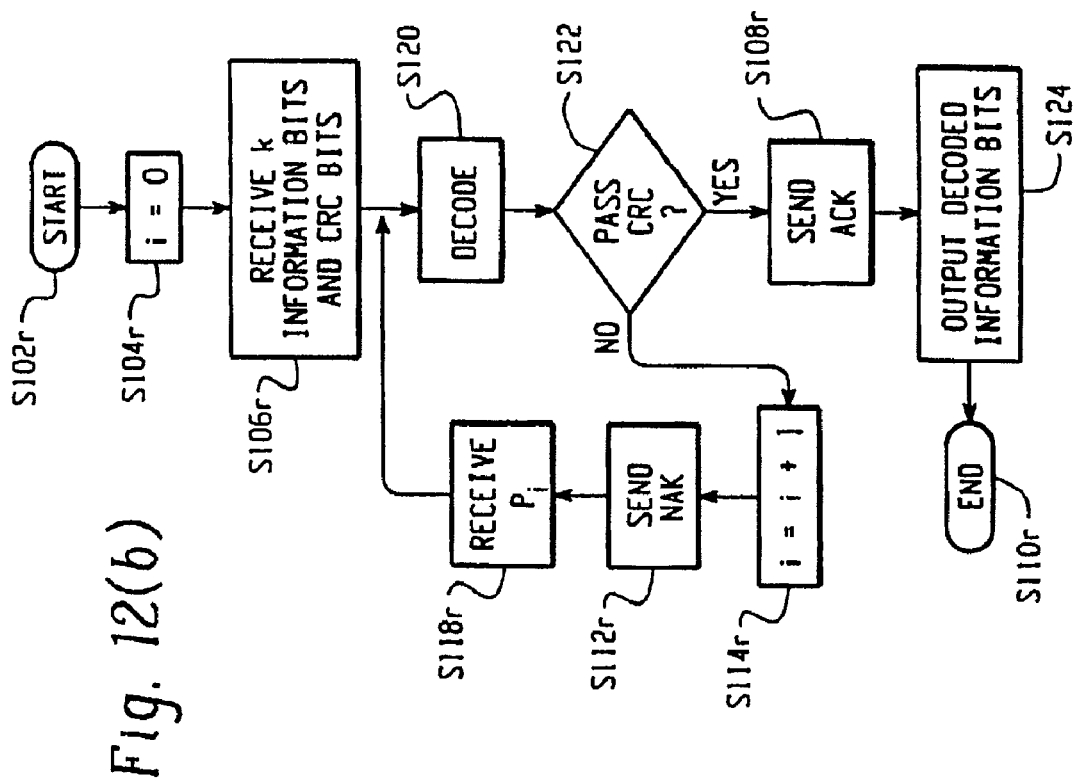
FIGS. 12($a$) and 12($b$) are flow diagrams similar to FIGS. 11($a$) and 11($b$), but illustrating concatenated HARQ.
Figure 12A:
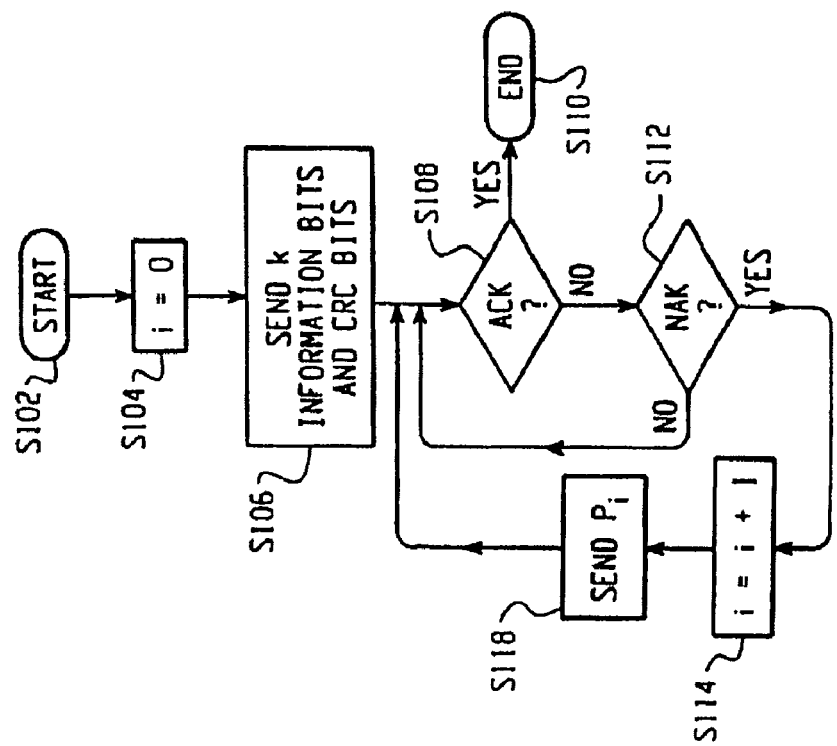

In a concatenated system, there is no low rate mother code. FIGS. 12(a) and 12(b) show the respective typical flows in a transmitter and a receiver of a concatenated hybrid-ARQ system. As for the punctured system flow shown in FIGS. 11(a) and 11(b), operations of a concatenated system start at steps S102 and S102r and a parity increment index is initialized to 0 at steps S104 and S104r. The systematic and CRC bits initially sent by the transmitter at a step S106 are received and decoded by the receiver at steps S106r and S120. If the decoded frame passes the CRC at step S122, then an ACK is sent to the transmitter at step S108r, the receiver outputs the decoded information bits (S124) and ends HARQ processing (S110r). The transmitted ACK (S108r) is detected by the transmitter at step S108, which then also ends its HARQ processing, at step S110. If the decoded frame does not pass the CRC check at step S122 however, the parity increment index i is incremented by 1 (S114r) and a NAK is sent to the transmitter (S112r). In the event of a NAK, detected by the transmitter at step S112, parity bits are generated from the previously sent bits and transmitted (S118). With each NAK, new parity bits are generated from some or all of the previously transmitted bits at step S118. A new parity increment $P_i$ is received by the receiver at step S118r and the decoding and CRC checking steps are repeated. This process continues until an ACK is sent by the receiver (S108r) and received by the transmitter (S108). Unlike punctured systems, there is no lower limit to the code rate that can be achieved with concatenated systems.

There are many possible ways in which concatenated systems can be implemented. In general, they involve either serial or parallel concatenation of codes. The individual codes involved may themselves be higher rate punctured versions of lower rate codes.

Figure 13:
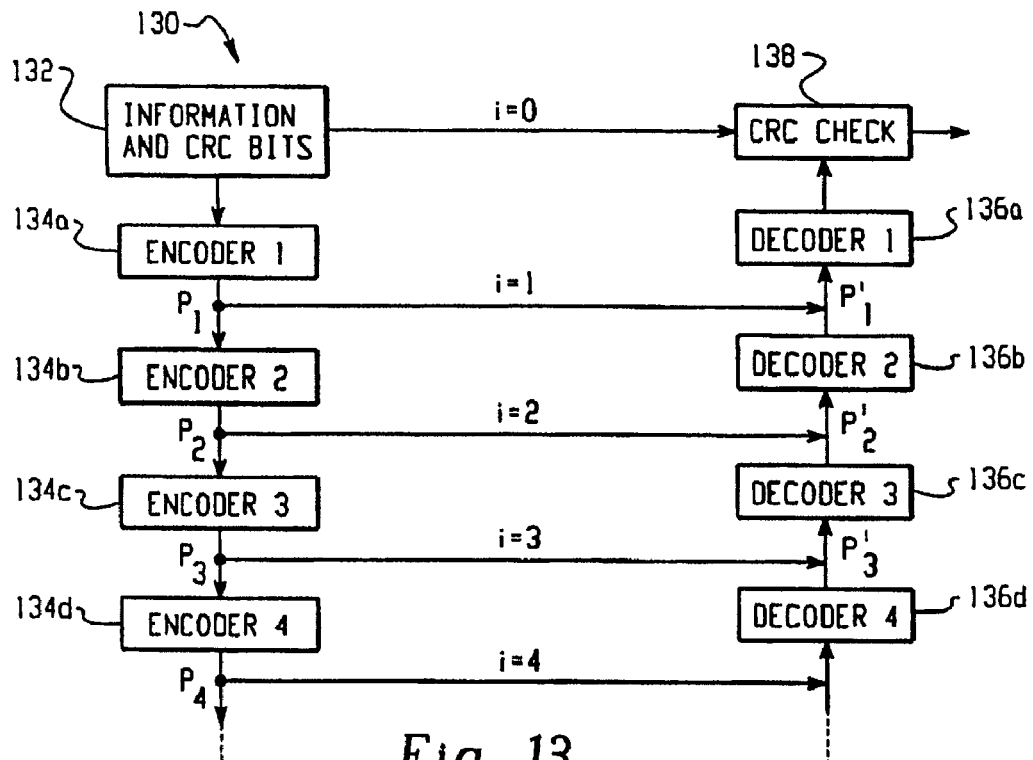
FIG. 13 is a block diagram of a serial concatenated coding system in which each transmitted incremental parity block is based on the previously transmitted parity block.
Figure 14:
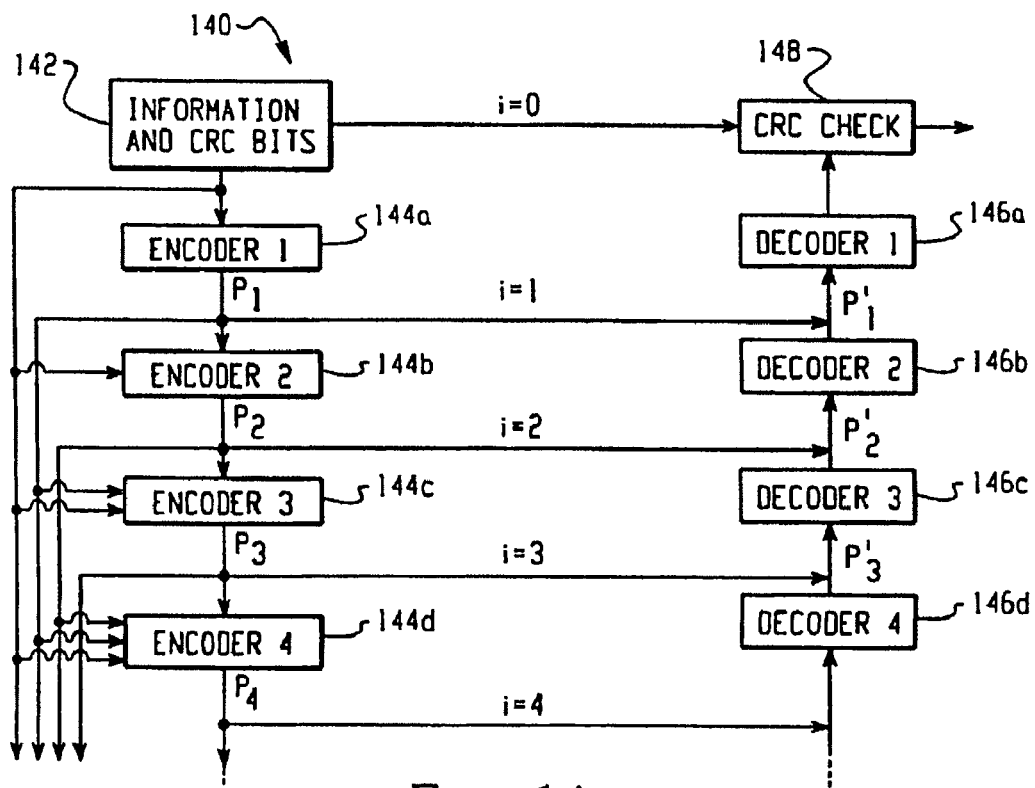
FIG. 14 is a block diagram of a serial concatenated coding system in which each transmitted incremental parity block is based on transmitted information and all previously transmitted parity blocks.

FIGS. 13 and 14 show serially concatenated systems. In FIG. 13, each new parity block $P_i$ is generated from the previously transmitted parity block, $P_{i-1}$, except of course $P_1$, which is generated from the systematic information bits directly. All encoders 134a-134d and decoders 136a-136d can be identical. They can implement either turbo codes or LDPC codes. In FIG. 14 however, new parity blocks are generated in encoders 144a-144d from all previously transmitted bits. By using all previously transmitted bits, the code performance will improve, provided that the decoders 146a-146d can exploit this feature. Such decoders for either turbo or LDPC codes would be highly complex and the concatenated system 130 as shown in FIG. 13 would therefore be preferred.

One problem with the concatenated approach is the length of each new parity block, $L_i$. It has been previously stated that throughput is maximized when $L_i=1$. Even if the encoders 134a-134d and 144a-144d shown in FIGS. 13 and 14 are high rate encoders, it may be difficult to get low values of $L_i$ for large values of k.

Figure 15:
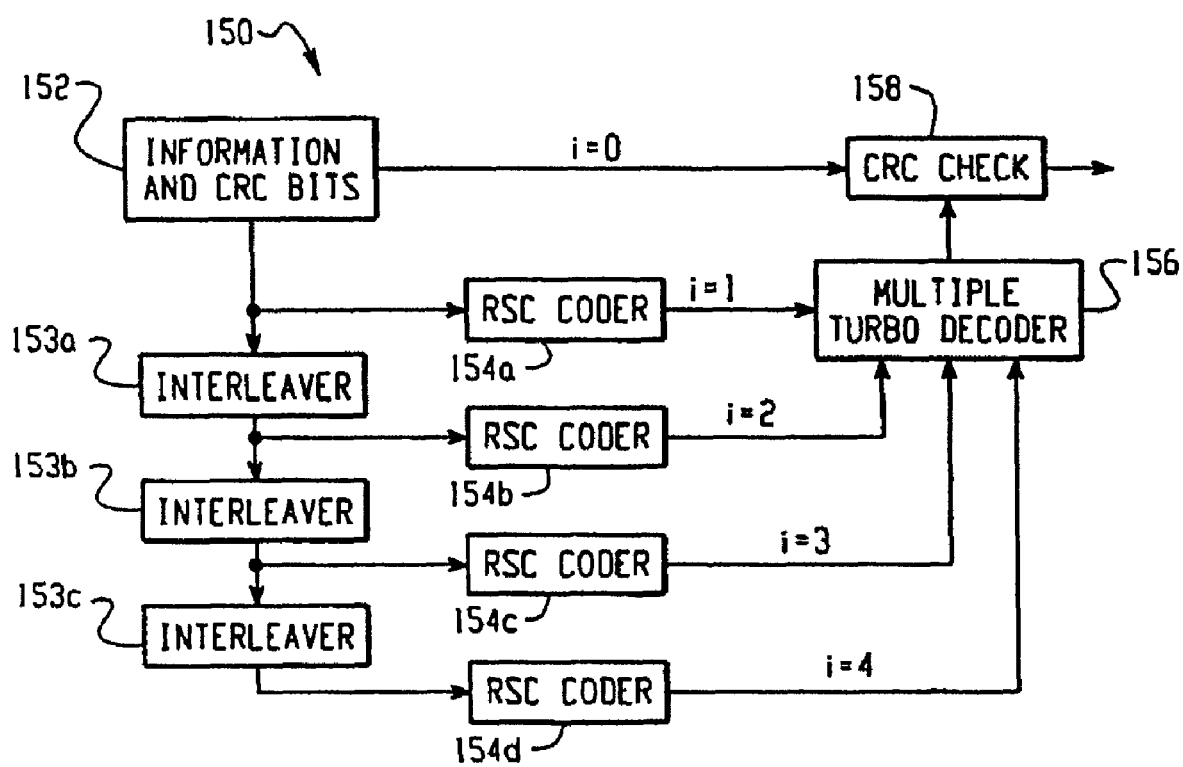
FIG. 15 shows a block diagram of a parallel concatenated turbo coding system.

Only turbo codes lend themselves to parallel concatenation. An example system 150 implementing parallel concatenation is shown in FIG. 15. On the encoding side, the example parallel concatenated turbo code system 150 includes four RSC coders 154a-154d and three interleavers 153a-153c, although other numbers of encoders and interleavers could obviously be used. A multiple turbo decoding algorithm must be used in the decoder 156. However, the multiple turbo decoder 156 has significantly higher complexity than the traditional turbo decoder.

Punctured HARQ involves the transmission of relatively small increments of parity. This is achieved through puncturing of the parity bits generated from the mother code. Puncturing a rate ⅓ turbo code to a rate ½ turbo code can be done, accomplished by discarding half the parity bits. Puncture masks to achieve rate ⅔, ¾, ⅞, etc. from a rate ½ convolutional code can also be done.

However, achieving an arbitrary amount of puncturing while ensuring that the punctured bits are evenly spread throughout a frame is significantly different and complex. Arbitrary puncturing is used to allow an arbitrary amount of parity to be transmitted. Even spreading of the punctured bits is preferred as a result of the trellis structure of turbo codes. It is desirable for parity bits used in a punctured turbo code to be evenly spaced in the trellis in order to maximize performance. Additionally, any puncturing strategy must meet rate compatibility requirements. This means that at any particular code rate generated by puncturing, the parity bits involved must also be used by any lower rate code that might also be generated by puncturing.

Arbitrary puncturing can be done if the total number of parity bits is an integer multiple of the amount of parity to be sent. Sending $1/10^{th}$ of the parity bits for example involves merely selecting every $10^{th}$ parity bit for transmission. However, sending 15% of the parity bits, which corresponds to $1/6.67^{th}$ of the parity is significantly more complex. Sometimes every $7^{th}$ bit is selected while every $6^{th}$ bit is selected at other times. This can be implemented in a controlled manner using an arbitrary rate generating accumulator as shown in FIG. 16 and described below.

According to an embodiment of the invention, the present invention allows for an arbitrary uniform puncturing approach, in which the transmitter "steps" through a buffer of the parity bits, one at a time. The puncturing process, illustrated by the flow chart in FIG. 16, begins at a step S162, preferably after a coder has generated the parity bits for a particular frame. Although shown as a separate step in the puncturing method, storing of the parity bits in a buffer (S164) may be performed by the coder. Several variables used in the puncturing method are then initialized in step S166. A parity bit index variable n, which is preferably a memory pointer or address variable, is set to 1 in step S166 of FIG. 16, to generally indicate the first parity bit. As will be apparent, n may also be initialized to a different value, such as a memory address in which the first parity bit is stored. Also in step S166, an accumulator σ is initialized to an initial value $\sigma_1$. The accumulator has a range of values the accumulator can store, and the accumulator overflows if the accumulator is incremented beyond the range.

If the fraction of parity bits to be transmitted on each retransmission is p (e.g., p=0.15 in the above example), then the increment value δ is initialized to a value pZ at step S166, where Z is preferably a large number determined by the size of the accumulator. For an a-bit accumulator for example, $Z=2^a$. (where "a" represents the bit storage size of the accumulator). On each "step" through the parity bit buffer, the increment value δ is added to the accumulator σ (S168). If, after adding δ, σ>Z (S170), then σ is reset to σ−Z and the nth parity bit is selected for transmission (S176). After selection of the nth parity bit for transmission at step S176, or if the accumulator does not overflow after addition of the increment δ, then the method proceeds at step S178 to determine if the nth parity bit is the final parity bit. If not, then the parity bit index or pointer n is incremented to point to the next parity bit in the buffer (S172) and steps S168 through S178 are repeated. This allows for any arbitrary amount of puncturing where the selected parity is distributed as evenly as possible.

It is possible that after this method has been repeated for all parity bits (i.e. an affirmative result at step S178), the number of parity bits selected may be one short of the number required for the desired amount of puncturing. This determination is made at step S180. In such a case, one additional parity bit, the first bit for example, is arbitrarily selected at step S182. This procedure is performed separately on the parity bits generated by each constituent encoder. This ensures that the output of each constituent encoder is equally represented in the transmitted parity bits. The value of Z and thus the accumulator should be large, on the order of $2^{32}$ for example, to ensure that the desired amount of puncturing is accurately obtained.

At step S184, the selected parity bits are transmitted. If the frame is properly received, then an ACK should be received (S186) and the process ends (S188). In the event of a reception error, a NAK should be received (S190) and a retransmission process is executed. According to the embodiment of the invention represented in FIG. 16, if the transmitter determines at step S192 that all of the parity bits have been sent, then the entire process is repeated, beginning at step S166.

Where some of the parity bits in the buffer have not been sent, those non-transmitted bits are punctured in order to select parity bits for transmission in a retransmission frame. For different retransmission frames, initializing the accumulator σ to a value equal to a different multiple of δ will ensure that different parity bits are selected and rate compatibility is achieved. This procedure is indicated in step S194, where a value of a variable l is selected, and step S196, in which the parity bit index n is reset to point to the first parity bit and the accumulator is set to lδ. However, since the increment δ is the same, this technique is applicable only if the same amount of parity is sent with every retransmission. A decoder would reproduce this process to determine where to locate the parity bits and erasures in its buffers.

Puncturing of FEC codes is typically implemented using puncturing "masks". A puncturing mask specifies which bits are punctured and which are retained within a block of data. For example, the puncture mask 0110010 specifies that 3 of 7 bits are selected, while 4 are punctured. The 1s in the mask correspond to bits in a 7-bit block that are selected, while the 0s correspond to those that are punctured. Typical puncture masks implement puncturing rates that are simple fractions. For example, a rate ⅓ code may be punctured to yield a rate ½, ⅔, ⅘ or ⅞ code.

The arbitrary puncturing approach described above can be viewed as a means of generating puncture masks for any arbitrary puncturing amount. Consider a puncturing example in which ¼ of the samples in a buffer are to be selected, such that ¾ of the samples are to be punctured. Assuming that the increment and accumulator are 3-bit values ranging from 0-7, all additions are modulo $2^3=8$. The increment value σ equals 2, ¼ of the maximum increment value of 8. The top row below represents the value of the accumulator after adding the increment value at each bit. The bottom row represents the corresponding puncture mask value, which is 1 only when the accumulator overflows and 0 otherwise. In this case, the puncture mask has a period of 4. Therefore a 4-bit long puncture mask completely describes the puncturing. In general, if the fraction of selected bits is represented as i/q where i and q are relatively prime integers, the puncturing mask will have a period of length q.

| accumulator | 0 | 2 | 4 | 6 | 0 | 2 | 4 | 6 | 0 | 2 | 4 | 6 | 0 |
|---|---|---|---|---|---|---|---|---|---|---|---|---|---|
| mask | | 0 | 0 | 0 | 1 | 0 | 0 | 0 | 1 | 0 | 0 | 0 | 1 |

An advantage to arbitrary puncturing is that a puncture mask for any puncturing amount can completely be described with just two numbers, the increment value δ and the initial value of the accumulator, $σ_1$ in FIG. 16. This means that the transmitter can inform the receiver (or vice versa) of the puncturing amount and hence code rate with a minimal exchange of information. This is in contrast with typical applications of puncturing, where the puncturing amounts are predetermined and stored in a lookup table in both the transmitter and the receiver.

Consider a scenario where a certain fraction of bits is initially selected. Subsequently, a different fraction of the remaining bits is to be selected for retransmissions. By only selecting from the remaining bits for the next retransmission, rate compatibility is ensured. For example, the original fraction might be ⅖ while the fraction of the remaining bits is ⅖. Here two increment/accumulator pairs are used, one nested within the other. The first accumulator, $σ_1$ is incremented by $δ_1$, which is equal to ⅖ of the maximum increment value. The top row below shows the puncture mask that results from this process. Each time $σ_1$ is incremented, but does not overflow, corresponding to the 0s in the puncture mask, the second, nested accumulator $σ_2$ is incremented by $δ_2$. $δ_2$ is equal to ⅖ of the maximum increment value, which is the same for $δ_1$ and $δ_2$. The second row below shows the puncture mask that corresponds to the bits that will be selected from the bits that were punctured initially.

and bit selection steps S168, S170, S174 and S176, thereby ensuring that parity bits for retransmissions are selected only from non-transmitted parity bits.

This method then proceeds as described above to "step" through the parity bit buffer, select bits for transmission in a current parity block, transmit the parity block and await an ACK or a NAK. In the event of a NAK, the entire method is repeated if all of the parity bits have been sent (S192). If some parity bits in the buffer have not been transmitted, then as shown at step S200, the parity bit index is reset to point to the first parity bit and both the accumulator σ and increment δ are set to values $σ_2$ and $δ_2$, different from the initial values $σ_1$ and $δ_1$ to which they are respectively set in step S166.

Figure 17:
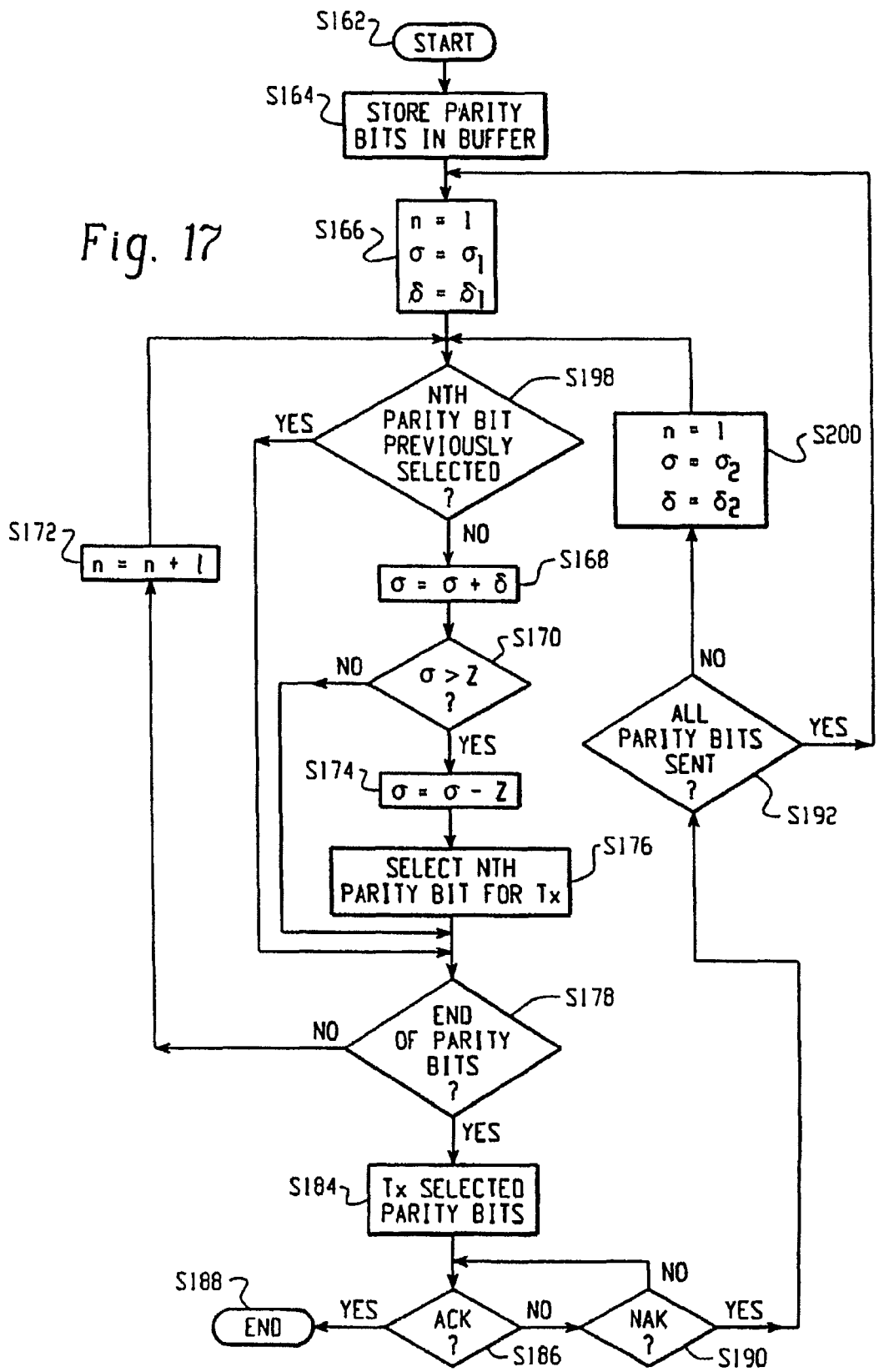
FIG. 17 is a flow diagram of an alternative puncturing method in accordance with a further embodiment of the invention.

With such a nested accumulator puncturing approach, a new level of nesting is required for any retransmission which requests a different number of parity bits from the previous retransmission in order to ensure rate compatibility. FIG. 17 shows an illustrative example having two nested accumulators, the first accumulator being used for the initial parity block and the second being used on all subsequent retransmission frame parity blocks. It will be obvious to those skilled in the art to which the invention pertains that further nested accumulators, each corresponding to different parity increments, are possible. Each such accumulator could also preferably be used for more than one retransmission frame. For example, initial transmission frame and first retransmission frame could include parity blocks generated by a first accumulator $σ_1$ and first increment $δ_1$, the next two retransmission frames could possibly include parity blocks generated by a second accumulator $σ_2$ and second increment $δ_2$, and then the parity blocks in the all subsequent retransmission frames may possibly include bits selected according to a third accumulator/increment pair $σ_3$, $δ_3$. Other combinations and numbers of nested accumulators are also contemplated.

An alternate approach to puncturing the parity bits uses an interleaver. One way of puncturing the parity bits in a manner that ensures rate compatibility is to send sequential blocks of parity with each retransmission request. For example, initially send the first 40% of the parity. In the event of a retransmission request, send the next 10% of the parity and so on.

| 0 | 0 | 0 | 0 | 1 | 0 | 0 | 0 | 1 | 0 | 0 | 0 | 0 | 1 | 0 | 0 | 0 | 1 | 0 | 0 | 0 | 0 | 1 | 0 | 0 | 0 | 1 |
|---|---|---|---|---|---|---|---|---|---|---|---|---|---|---|---|---|---|---|---|---|---|---|---|---|---|---|
| 0 | 0 | 1 | 0 | | 1 | 0 | 0 | | 1 | 0 | 1 | 0 | | 0 | 1 | 0 | | 1 | 0 | 0 | 1 | | 0 | 1 | 0 | |

This nested accumulator approach is illustrated in the flow diagram in FIG. 17. The steps in FIG. 17 which correspond to those in FIG. 16 have been similarly labelled and have been discussed above. The initial steps in the flow chart of FIG. 17 are substantially the same as in FIG. 16, except that the increment value δ is initialized to a general predetermined value $δ_1$, which is preferably pZ as discussed above. The method illustrated in FIG. 17 further differs from that of FIG. 16 primarily in its retransmission processing steps. As discussed above, initializing the accumulator to a different multiple of the increment for each retransmission at step S196 ensures rate compatibility in the FIG. 16 embodiment. In FIG. 17, the step S198 provides for rate compatibility. If the nth parity bit has been selected for transmission in a previous parity block, then the method proceeds to the end of the parity bit selection loop, bypassing the accumulator incrementing The size of these parity blocks can be arbitrarily determined which allows arbitrary puncturing. In this case, the parity bits after each retransmission will not be spread out evenly through the overall frame of parity, and hence through the trellis.

However, if the parity bits are interleaved prior to being selected in sequential blocks for retransmission, it is possible to ensure that they are evenly spread throughout the original, uninterleaved parity frame. The selection of interleaver pattern is contributes to the operation of this approach. For example, consider a case where only 5% of the parity bits are sent after the first NAK, 10% (in total) after the second NAK, 20% (in total) after the third NAK and so on. This means that the parity increment size is 5% of the total parity for the first two NAKs and 10% subsequently. Possible puncture masks that correspond to these parity increments are shown below.

| | | | | | | | | | | | | | | | | | | | | |
|---|---|---|---|---|---|---|---|---|---|---|---|---|---|---|---|---|---|---|---|---|
| 5% | 1 | 0 | 0 | 0 | 0 | 0 | 0 | 0 | 0 | 0 | 0 | 0 | 0 | 0 | 0 | 0 | 0 | 0 | 0 | 0 |
| 10% | 1 | 0 | 0 | 0 | 0 | 0 | 0 | 0 | 0 | 0 | 1 | 0 | 0 | 0 | 0 | 0 | 0 | 0 | 0 | 0 |
| 20% | 1 | 0 | 0 | 0 | 0 | 1 | 0 | 0 | 0 | 0 | 1 | 0 | 0 | 0 | 0 | 1 | 0 | 0 | 0 | 0 |
| 30% | 1 | 0 | 0 | 1 | 0 | 1 | 0 | 0 | 0 | 0 | 1 | 0 | 0 | 1 | 0 | 1 | 0 | 0 | 0 | 0 |
| 40% | 1 | 0 | 0 | 1 | 0 | 1 | 0 | 0 | 1 | 0 | 1 | 0 | 0 | 1 | 0 | 1 | 0 | 0 | 1 | 0 |
| 50% | 1 | 0 | 1 | 1 | 0 | 1 | 0 | 0 | 1 | 0 | 1 | 0 | 0 | 1 | 0 | 1 | 0 | 1 | 1 | 0 |

Note that rate compatibility is ensured by the fact that every 1 in the puncture mask of a given row has 1's below it, such that any higher rate code resulting from puncturing includes the parity bits from the lower rate codes. It is also clear that the parity bits selected for the cases of 5%, 10% and 20% are evenly spread through the parity frame and hence through the trellis in the case of turbo codes.

An interleaver may be used which will yield the puncturing described here. In the case where 5% of the parity is transmitted after the first NAK, the first 5% of the interleaver array is used to determine the indices of the parity bits to be transmitted. In order to achieve the above puncture mask, the first 5% of the interleaver array should begin with the first parity bit and skip along in increments of 20. The next 5% should begin at the 10th parity bit and increment by 20. The next 10% should begin with the 5th parity bit and increment by 10. Subsequent interleaver values can be randomly selected from the remaining parity bits.

Although the above interleaver design is based on the concept of sending parity increments of initially 5% of the total and subsequently 10% of the total, it is still applicable to any arbitrary amount of puncturing. To send 37% of the parity, those parity bits indexed by the first 37% of values in the interleaver are sent. The advantage here is that no computation or nested structures are required to implement the puncturing.

There are clearly many ways in which turbo or LDPC codes can be applied to HARQ. Throughput analysis of SR-ARQ systems indicates that throughput would be maximized when the parity increment size is small. The nature of concatenated systems limits the ability to control the parity increment size. Small parity increment sizes can only be achieved through the use of very high rate codes as the constituent codes in concatenated systems.

In contrast, punctured systems allow for significant control over the size of parity increments transmitted. Two techniques for arbitrary puncturing are described above. Puncturing the mother code allows selection of any parity increment size; even the minimum possible parity increment size of one. For purposes of illustration, analysis of systems based on puncturing turbo codes and LDPC codes using the interleaver puncturing approach have been conducted and the results are discussed below.

The throughput of selective repeat HARQ systems depends on the number of parity bits sent and the decoded FER after each transmission for a given frame of data. Therefore, the performance of punctured HARQ systems can be determined by obtaining the FERs when the mother code is punctured by amounts that correspond to each of the different parity increment sizes.

Given a way of selecting an arbitrary puncturing amount for each transmission, the amount of puncturing is to be determined. As discussed above, throughput is maximized when the parity increment size is small. However, feedback channel traffic increases as the parity increment decreases in size, due to a relatively large number of NAKs prior to frame acceptance. In example turbo HARQ simulations, a parity increment size of 10% of the total number of parity bits was selected. For example, if k=1000, there would be 2000 parity bits generated by the example rate ⅓ turbo encoder. The first two transmitted blocks of parity comprise only 5% of the total parity, or 100 bits and subsequent transmitted parity frames would have a length of 200 bits in the above example. In an illustrative example LDPC HARQ simulations below, the mother code is a rate ⅓ code and the first two parity blocks transmitted consist of 10% of the total parity while all subsequent parity blocks have a length equal to 20% of the total parity.

Initially, no parity bits should be sent, in which case the FER is that associated with an uncoded system. Subsequent FERs can be obtained by simulating the performance of the mother code with the appropriate amount of puncturing. The FER data and known parity increment sizes can then be used to determine the throughput.

Prior to discussing simulation results, details of the simulations and implementations chosen for such simulations will be presented. These implementations are for illustrative purposes only and represent example preferred embodiments of aspects of the invention. The invention is in no way limited thereto.

In another example of the present invention, the present invention uses an SR-ARQ system. SR-ARQ systems offer the best possible throughput of all ARQ systems, since only frames in error are retransmitted. SR-ARQ systems require that both the transmitter and receiver have the capability of storing multiple frames of data. In the case of the transmitter, this data is in the form of hard bits. In the receiver, this data is in the form of soft, unquantized channel output values. The simulation system model additionally assumes that both the transmitter and receiver have infinite storage capacity. Although this may appear to be unreasonable, where the frame size k is 1000 bits for example, even if the transmitter and receiver were to store 150 frames of data, only 1 Mbyte of memory would be required in the example HARQ implementations. Modern semiconductor memory is cheap and compact enough that an assumption of infinite memory for this application is quite reasonable.

It is also assumed that transmission delay is irrelevant. The throughput of SR-ARQ systems is not affected by the transmission delay, unlike SW-ARQ and GBN-ARQ. The amount of storage required in the transmitter and receiver is affected by delay, as well as other system parameters, such as frame size. However, since infinite memory is assumed, delay issues can mostly be ignored.

ARQ systems also require a feedback channel, which is assumed to be error free. This can be accomplished in a variety of ways. Powerful, low-rate FEC can be used on the feedback channel to give a very low BER. However, this typically will not be necessary. Communication is commonly full duplex, meaning that there is two-way traffic. For a given transmission, the complementary channel can be used to carry feedback information. This channel may also implement the same HARQ system and this will guarantee that accepted feedback packets are error-free. Since feedback channel traffic is typically much lower than the transmitted data rate, using the complementary channel as a feedback channel results in minimal overhead.

For error detection, 16-bit CRC blocks are assumed for frame lengths of 1000 or higher and 12-bit blocks are assumed for shorter frames. For 16-bit CRC codes, the worst-case missed error detection probability is $2^{-16}=1.5\times10^{-5}$. This worst case is achieved at very low SNRs when the BER is 0.5. It is very unlikely that any system will actually operate at such a low SNR. Practical undetected error rates for 16-bit CRC codes are normally many orders of magnitude lower.

In the simulated implementation, a rate ⅓ turbo code is used. A lower rate turbo code was not used in order to minimize decoding complexity. The code generator polynomials are octal 35/23 and the memory is 4. A spread interleaver is used in the turbo encoder and decoder. Two different turbo decoder implementations were simulated, as will become apparent below. The first version uses a standard FBA constituent decoder. A reduced complexity max-sum constituent decoder is implemented in the second decoder instead of a FBA decoder. An advantage of the max-sum decoder is that it has approximately one-eighth the complexity of the FBA decoder in the simulated implementations. The turbo decoder computes a CRC check after each decoding iteration and terminates if there are no errors. The maximum number of iterations is varied from 6 to 20 iterations. If the CRC check is not passed after the maximum number of iterations, the decoder assumes the frame is still in error and sends a NAK.

The simulated LDPC implementation uses regular parity check matrices which are generated following Gallager's construction in the above-referenced article. In particular, a rate ½ code is used with a parity check matrix containing six 1s per row and three 1s per column. The block lengths simulated are (n, k)=(10020, 5010) and (504, 252). The decoder uses message passing on the factor graph to decode the received data. This approach is known as the "belief propagation" or the "sum-product" algorithm. This decoding approach is iterative and the decoder computes a CRC check after each iteration. The decoder terminates if there are no errors or the maximum number of iterations has been reached. The maximum number of iterations is varied from 40 to 1000. If the CRC check is not passed after the maximum number of iterations, the decoder assumes the frame is still in error and sends a NAK.

The ranges for the maximum number of iterations considered for both turbo codes and LDPC codes were based on typical values used in the art. Note that there is no relationship between the number of iterations used in turbo and LDPC decoders. One turbo iteration is not equal in complexity to one LDPC iteration.

In the case of LDPC codes, additional decoding steps were necessary. As mentioned previously, regular LDPC matrices were used. An LDPC matrix H is first generated. The corresponding generator matrix G is then generated by finding the null space of H. This generator was then converted into its systematic equivalent G' through the use of row operations and column swaps. All column swaps applied to G to generate G' were also applied to H to generate H'. H' is an LDPC matrix with the same number of 1s per row and per column as H, but corresponds to a systematic generator matrix. The LDPC simulation then uses H' and G' for encoding and decoding purposes.

All the LDPC simulations described below generate random information sequences and encode them by multiplying by a systematic generator matrix. This introduces significant computational and memory penalties in the simulations but it more realistically reflects the complexity associated with LDPC code implementations.

The two different channels considered are the AWGN channel and the fully interleaved Rayleigh fading channel with perfect CSI. The assumption of full interleaving for fading channels allows generation of Rayleigh fading amplitude values a which are independent of each other. Throughput performance was assessed for a variety of different implementation parameters, including frame length, decoding algorithm and maximum number of iterations. For FER data, at least 30 frame errors were counted. This minimum value was used at the lower FERs ($<10^{-3}$). At higher FERs, many more frame errors were counted. FER data and parity increment sizes were then used to compute throughput. In all cases, the throughput curves are plotted alongside the channel capacity, determined in accordance with known techniques.

Figure 18:
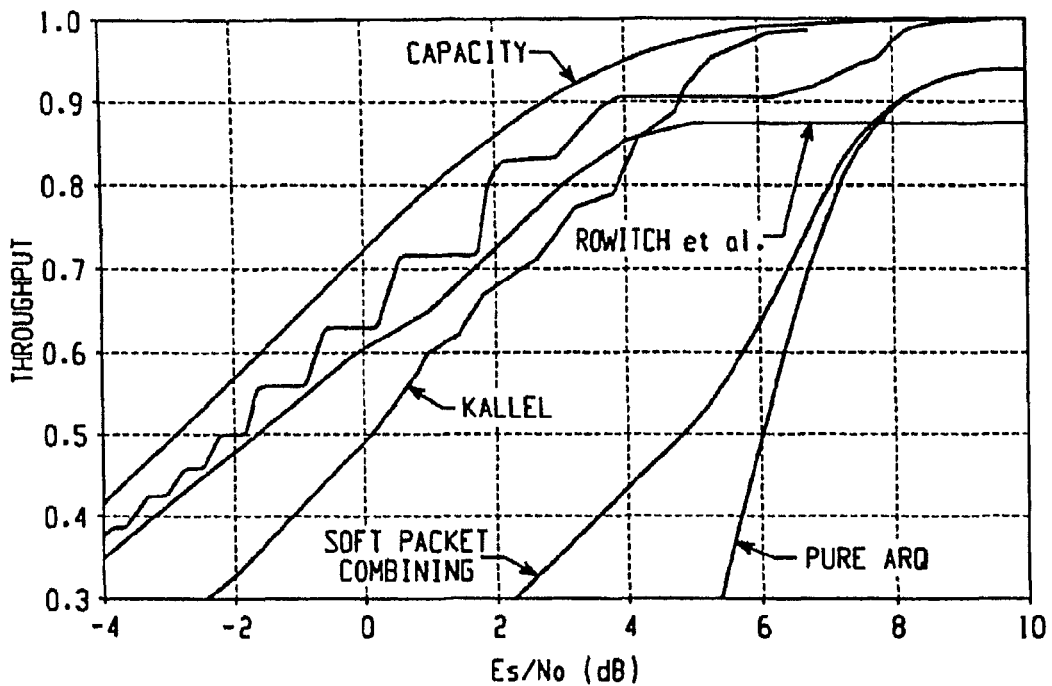
FIG. 18 shows plots of throughput vs signal to noise ratio (SNR) for several known systems and a turbo HARQ scheme in accordance with an aspect of the invention, relative to channel capacity, for an AWGN channel, the inventive turbo HARQ scheme using FBA decoding and a frame length k=10000.
Figure 19:
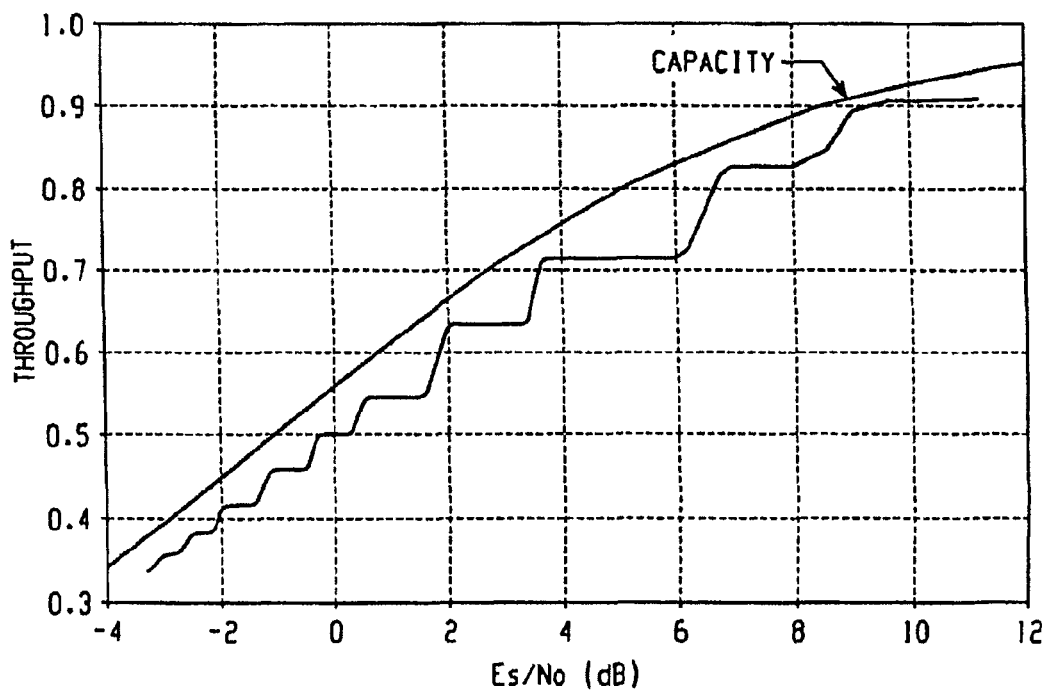
FIG. 19 is a plot similar to FIG. 16, showing turbo HARQ throughput vs. SNR for an inventive turbo HARQ scheme using FBA decoding and k=10000 on a Rayleigh fading channel.

FIG. 18 shows the best turbo HARQ performance achieved with the invention in an AWGN channel, while FIG. 19 shows the best performance in a Rayleigh fading channel. This performance was achieved with a frame length k=10000 and a decoder using the FBA. The "staircase" effect is clearly visible and is a result of two factors. The first is that blocks of parity are sent with each retransmission request. The second is that turbo codes with long frame lengths typically perform poorly up to a certain threshold SNR and then perform very well. This means that over a narrow SNR range, on the order of 0.5 dB for example, the FER may drop from $10^{-1}$ to $10^{-3}$.

The AWGN throughput is between 0.5 and 2 dB from the channel capacity. The throughput results for pure ARQ with and without soft packet combining are also presented in FIG. 18. The throughput results for the pure ARQ and soft packet combining cases assume values of k=240 and r=16. The throughput in the Rayleigh fading channel is also close to the channel capacity, as shown in FIG. 19.

The performance of the known HARQ systems presented in S. Kallel, "Efficient Hybrid ARQ Protocols With Adaptive Forward Error Correction", *IEEE Trans. on Commun.*, vol. 42, pp. 291-289, February 1994 and in the paper by D. N. Rowitch and L. B. Milstein, referenced above, are also shown in FIG. 18. These throughput curves are the best HARQ results that appear in the prior art. Note that the results from Kallel are not based on simulations of the actual code performance, as is the case with the results for the instant invention. Instead, the throughput in Kallel is based on an analytical bound on the performance of the convolutional code used in that approach.

Figure 20:
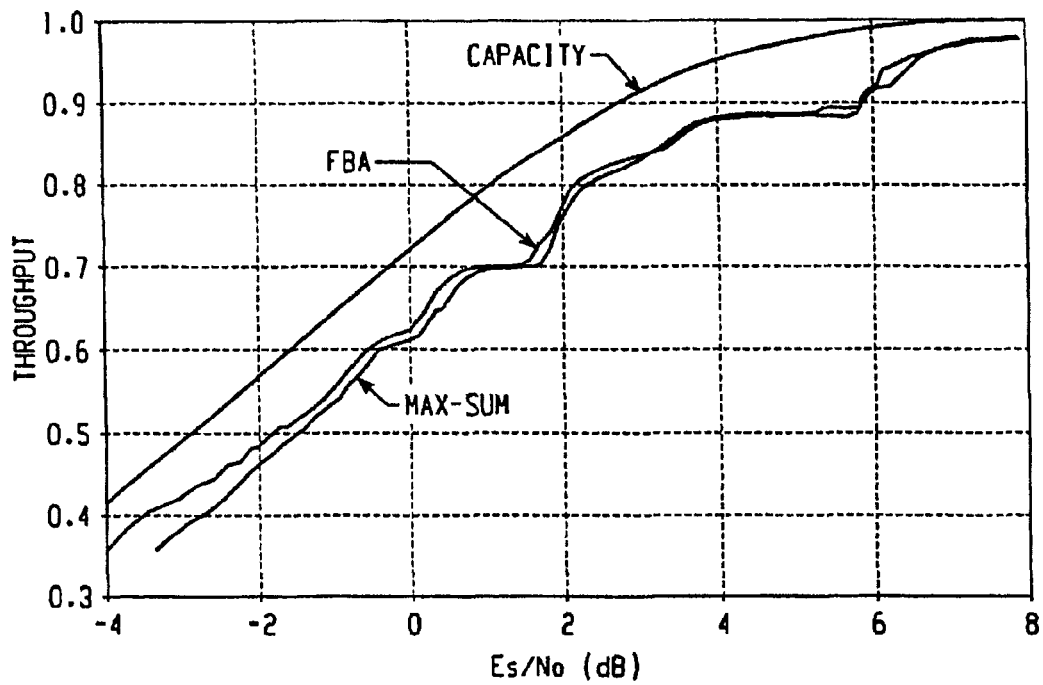
FIG. 20 shows throughput vs. SNR for two different embodiments of the invention, corresponding to turbo HARQ schemes with FBA decoding and max-sum decoding, with k=1000 and on an AWGN channel.

As discussed above, several different algorithms can be used for the constituent decoders in a turbo decoder, of which two are considered in detail, the FBA and the max-sum variant of the FBA. The throughput curve was obtained for a turbo-HARQ system with a frame length k=1000 in an AWGN channel using both decoding algorithms. FIG. 20 shows the performance in these two cases. The performance of the system using the FBA is approximately 0.3 dB better at SNRs below about 1 dB but virtually identical at higher SNRs. However, the max-sum decoder has approximately one-third the computational complexity of the FBA decoder. These results show that significant complexity reduction can be obtained with very little performance degradation.

Figure 21:
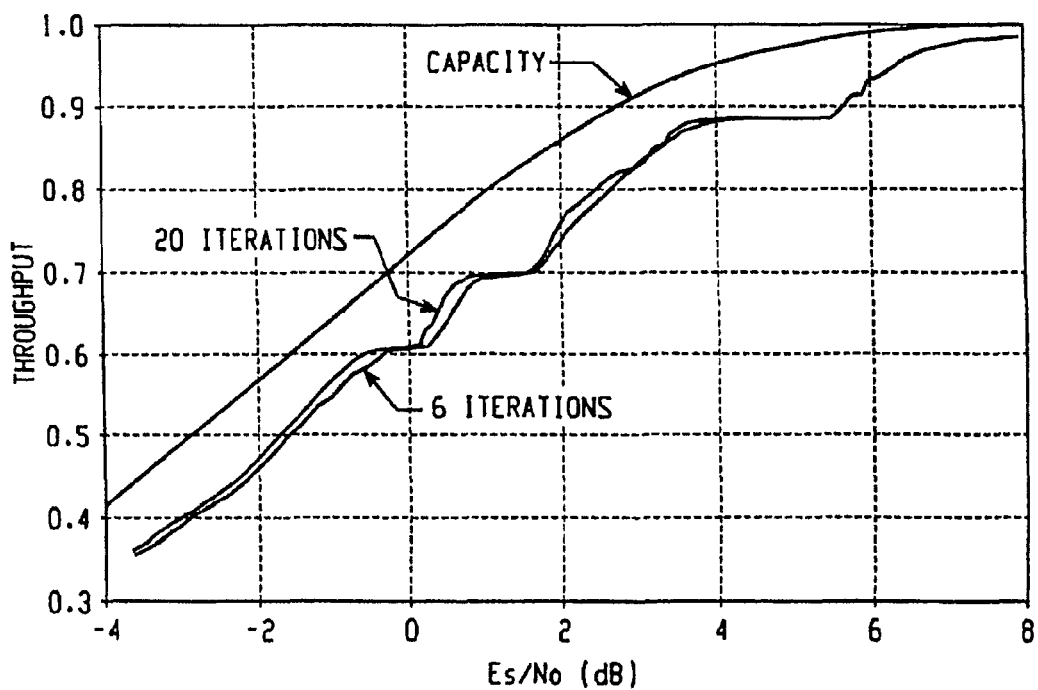
FIG. 21 plots throughput vs. SNR for turbo HARQ schemes using 6- and 20-iteration max-sum decoding, with k=1000 and on an AWGN channel.

The performance of a turbo decoder improves as the number of iterations increases. It has been discussed earlier that a turbo HARQ decoder uses early termination to reduce complexity. However, a maximum number of iterations, after which a frame is declared in error, must be specified. Two cases of turbo HARQ using a frame length of k=1000 in an AWGN channel, with a maximum number of iterations of 6 and 20, were simulated. The results of such simulations are shown in FIG. 21. The performance with a maximum of 20 iterations is a fraction of a dB better, at the price of higher computational complexity. This increased price is not actually as high as the ratio between 20 and 6 iterations. This is because the early termination feature means that many frames will decode with significantly fewer iterations than the maximum.

Figure 22:
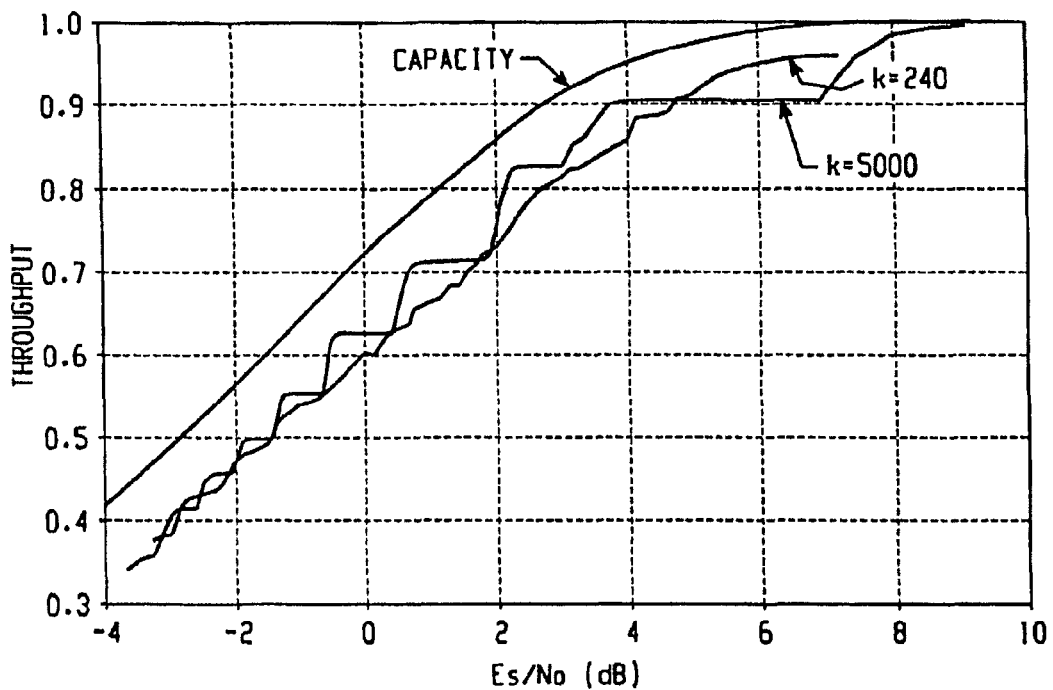
FIG. 22 shows throughput vs. SNR for a turbo HARQ schemes with max-sum decoding, k=5000 and 240, and on an AWGN channel.
Figure 23:
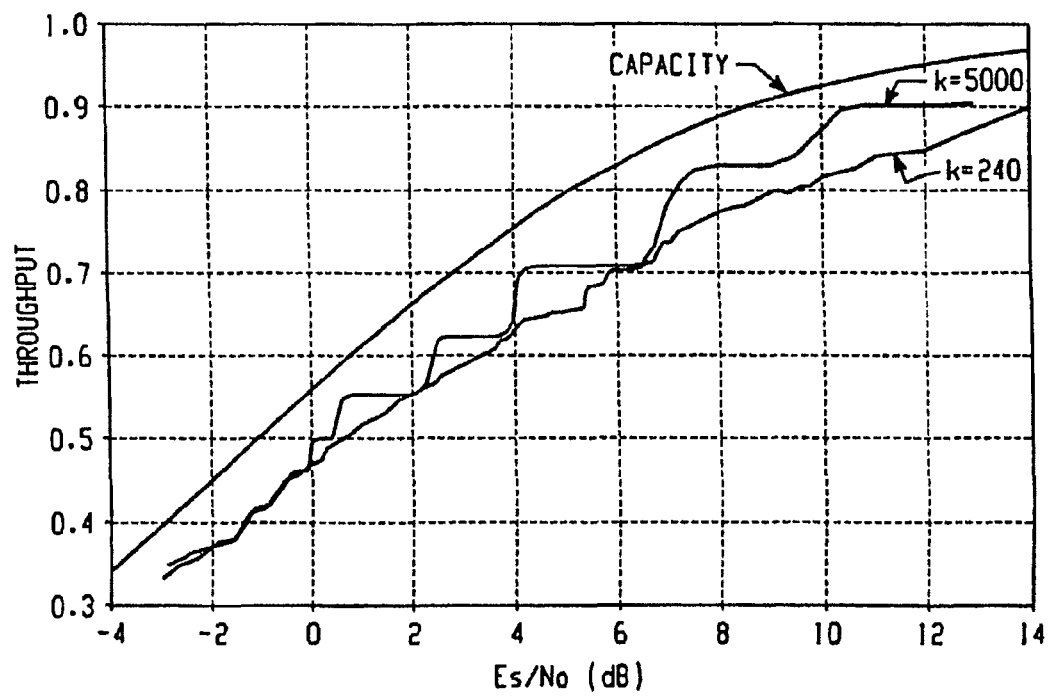
FIG. 23 shows throughput vs. SNR plots similar to those in FIG. 20, for turbo HARQ schemes with max-sum decoding, k=5000 and 240, but on a Rayleigh fading channel.

Frame length is an important system parameter in many communications applications. In order to investigate the effect of frame length on turbo HARQ system performance, various frame lengths were simulated. In FIG. 22, the throughputs with two different frame lengths, k=240 and k=5000, using the max-sum decoder in AWGN are shown. FIG. 23 compares the two different frame lengths in a Rayleigh fading channel. It is clear that in both AWGN and Rayleigh fading channels, the systems with a longer frame length perform better. However, the short frame length cases still perform within 2 dB of capacity in the AWGN channel and 4 dB of capacity in the Rayleigh fading channel. Note that the short frame length (k=240) throughput curves in both channels do not display the "staircase" effect seen with the longer frame lengths.

Figure 24:
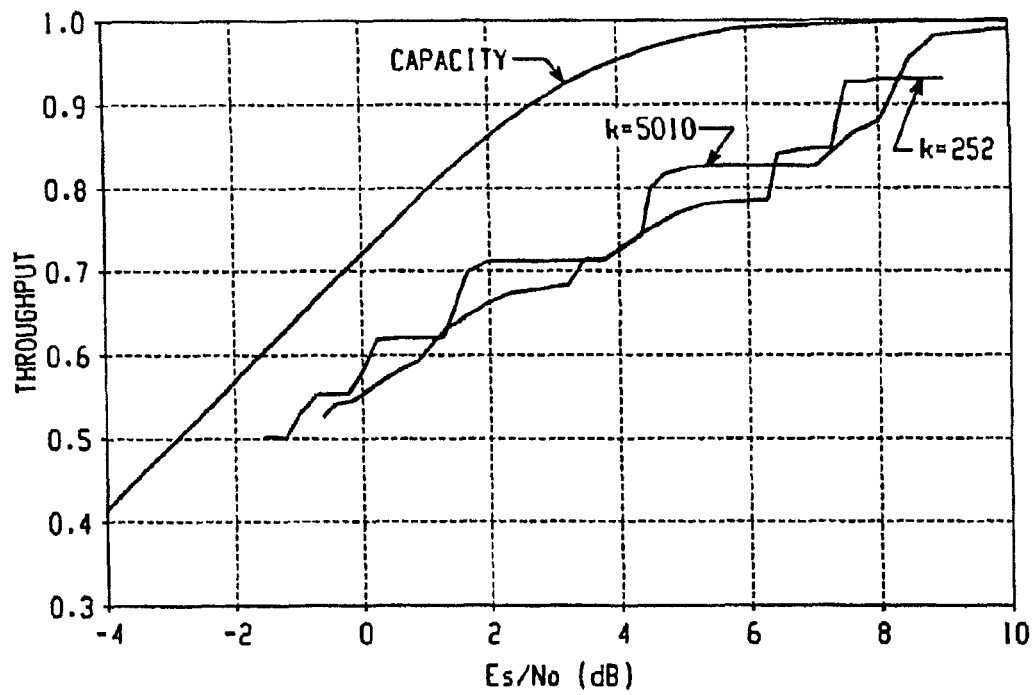
FIG. 24 shows LDPC HARQ performance for k=5010 and 252, on an AWGN channel.
Figure 25:
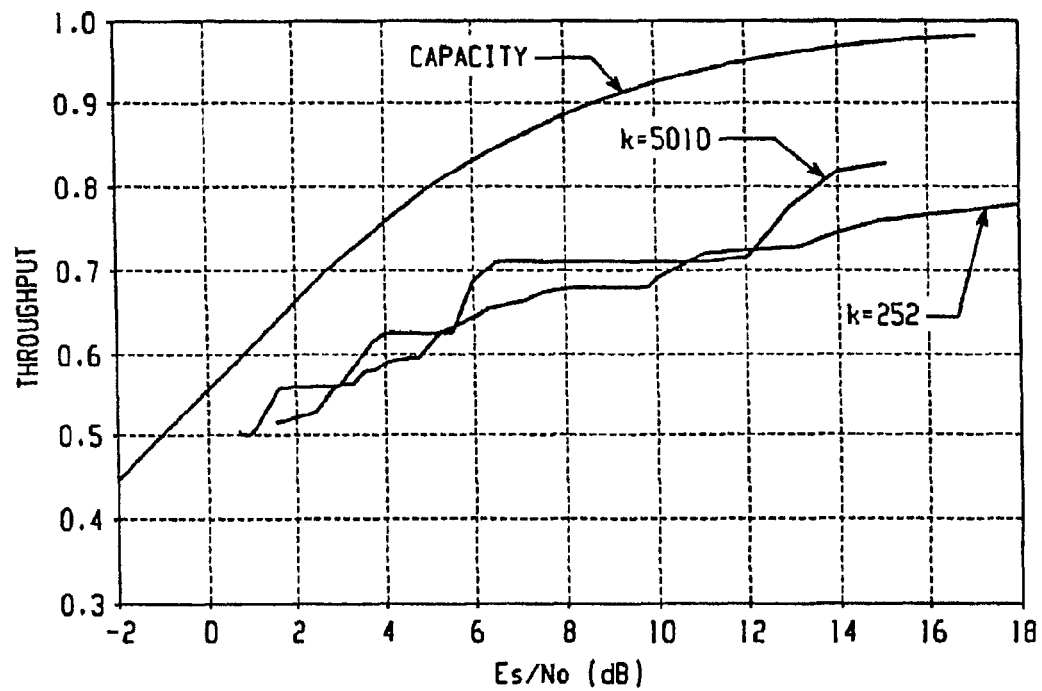
FIG. 25 shows throughput vs. SNR plots for LDPC HARQ with k=5010 and 252 for a Rayleigh fading channel.

FIG. 24 shows the throughput performance of LDPC HARQ for block lengths of k=252 and k=5010 on an AWGN channel. The throughput curves for both frame lengths are significantly worse than in the turbo HARQ case. However, the results indicate that LDPC HARQ systems also retain their performance over a wide range of block lengths. FIG. 25 shows the throughput for the same two frame lengths in a Rayleigh fading channel. Again, the throughputs are much further away from the channel capacity than the turbo HARQ throughputs.

Figure 26:
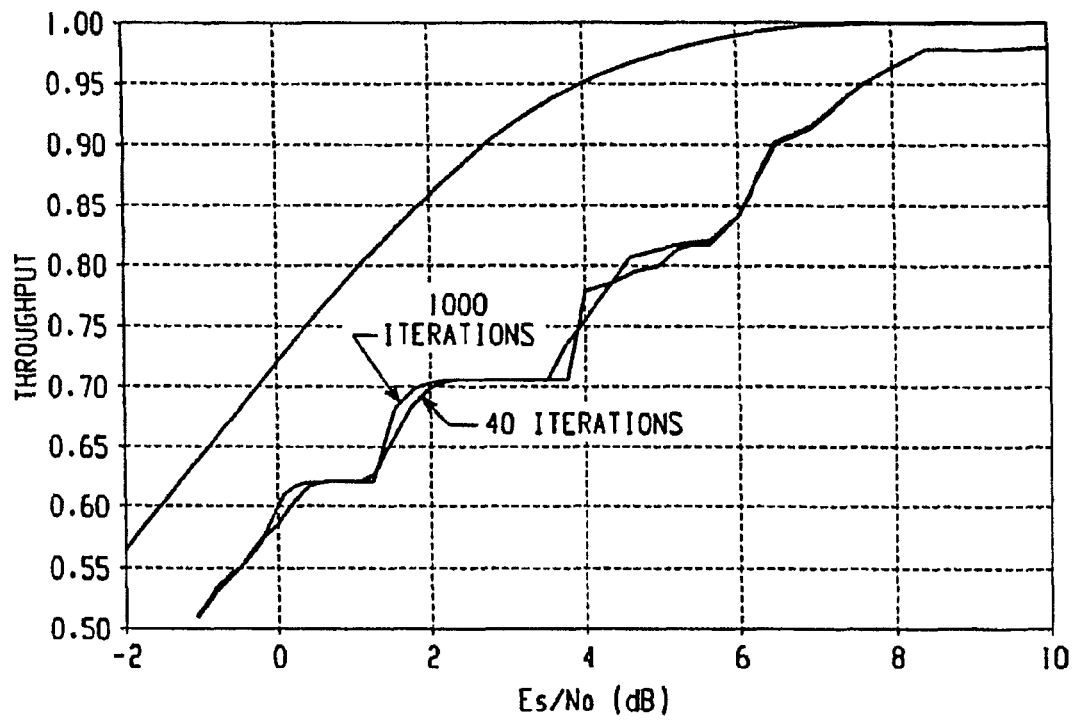
FIG. 26 plots LDPC HARQ throughput performance for k=1002, on an AWGN channel, with 1000- and 40-iteration decoding.

As is the case with a turbo decoder, the LDPC decoder also performs better when more iterations are used. According to an aspect of the instant invention, early termination is used to reduce decoding complexity. However, similarly to the turbo HARQ system, a maximum number of iterations after which a frame is declared in error must be set. FIG. 26 compares the throughput performance between two cases where the maximum number of iterations is 40 and 1000. The frame length k=1002. There is no significant difference in performance between the two cases. Clearly, little performance improvement is gained from the higher maximum value of decoding iterations in the case of LDPC HARQ.

These performance results indicate that turbo HARQ significantly outperforms LDPC HARQ in both channels considered here. However, computational complexity and memory requirements of the two approaches also differ. Encoder and decoder complexity are discussed separately below.

The turbo encoder has relatively low computational complexity. The "shift register circuit" type implementation shown in FIG. 5 requires a minimal number of computations for each generated bit. The complexity of the turbo encoder increases linearly with the frame length. The interleaving operation requires a memory buffer of length k. In comparison, LDPC encoders have a significantly greater complexity. Here, the encoding process involves multiplying an information frame u of length k by the generator matrix G to yield a codeword v. The complexity of this matrix multiplication is proportional to the square of the frame length. Additionally, there are significant memory requirements. At a minimum, the non-systematic portion of the generator matrix must be stored. For rate ½ codes with frame lengths of k=1000 and k=10000, this requires 125 Kbytes and 12.5 Mbytes of memory, respectively.

Considering now the decoder, two different turbo decoders and one LDPC decoder have been implemented in the example simulation embodiments. The two turbo decoders are based on FBA and max-sum constituent decoders. The memory requirements of all the decoders are roughly comparable to several times the channel frame length n. However, their computational complexity differs significantly. To compare their computational complexity, the performance of each of the three decoders with a rate ½ code with a frame length k=1000 was simulated. The speed of decoding in the simulation environment is shown below.

| System | Simulation Speed |
|---|---|
| LDPC Decoder | 3 kbit/s |
| Turbo decoder with FBA | 9.1 kbit/s |
| Turbo decoder with max-sum | 30 kbit/s |

The specific values here are unimportant, as they are implementation dependent and thus for illustrative purposes only. However, the relative values among the different decoders are significant. Clearly, turbo codes have significantly lower complexity and higher simulation speed in this particular implementation. The turbo decoder with the sub-optimal max-sum constituent decoder is 10 times faster than the LDPC decoder. In alternate implementations, this may not be the case. LDPC decoding lends itself to a great degree of parallelization. This is because C-S messages from different checks can be computed simultaneously. Therefore, an LDPC decoder with multiple, parallel C-S computation units has the potential of performing faster than a turbo decoder. Both turbo and LDPC types of coding are contemplated in the invention.

Figure 27:
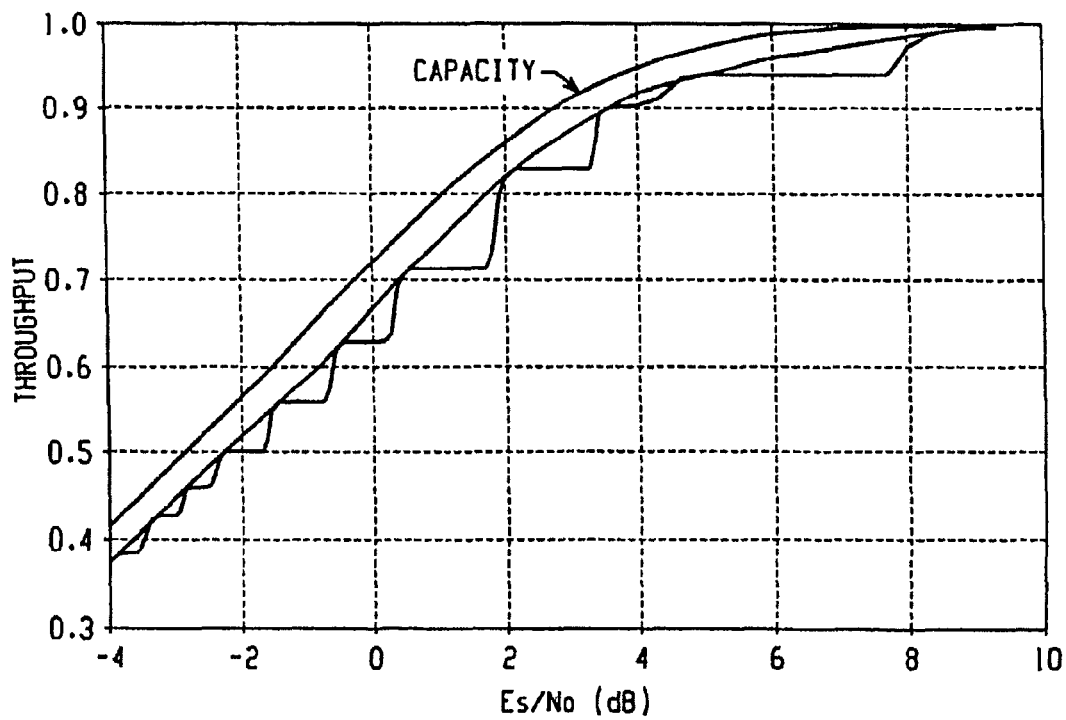
FIG. 27 shows the best simulated turbo HARQ throughput performance plot and the best possible turbo HARQ performance.

The throughput curves in FIGS. 18-26 show excellent performance, particularly in the case of turbo HARQ. Turbo HARQ systems clearly perform close to channel capacity. One interesting feature of these throughput curves is their step nature. This arises from the size of the parity increment blocks. At the "knees" of the curve, the throughput is very close to capacity, within less than 1 dB of capacity in the best case. However, at its worst, even the best throughput curve is almost 2 dB from capacity. In FIG. 27, the throughput curve from FIG. 18 for the inventive turbo HARQ system is plotted along with its convex hull. In a further preferred embodiment of the invention described below, the throughput performance of the convex hull curve can be achieved, in which case throughput performance within 1 dB of capacity is always achievable.

According to this further preferred embodiment, all retransmission details are controlled by the receiver. The receiver decides how much parity should be transmitted based on its estimate of the channel signal to noise ratio $E_s/N_0$. It then informs the transmitter how much initial parity to transmit with each frame via information on the feedback channel. As will be apparent to those skilled in the art to which the invention pertains, there are many known ways in which the receiver can reliably estimate the channel $E_s/N_0$.

Once it estimates $E_s/N_0$, the receiver can determine the exact throughput that can be achieved, based on stored throughput curve data, implemented for example in the form of a table lookup or polynomial approximation. The receiver will then instruct the transmitter to send each information frame with an initial block of parity that exactly corresponds to this throughput. The puncturing strategy described above allows for arbitrary parity block lengths. Retransmission requests should be rare and feedback channel traffic minimal since the amount of parity initially transmitted will likely result in successful decoding. In the unlikely event of an erroneous frame, a NAK will be sent and more parity will be transmitted.

In the case of non-stationary channels such as in mobile communication systems, or erroneous $E_s/N_0$ estimates, it is possible that the amount of parity initially sent is either too much or too little. If it is too little and frames are decoded in error, the standard NAK feedback process will ensure that sufficient parity is subsequently transmitted to ensure frame acceptance. If too much parity is being sent, the throughput might be somewhat lower than channel conditions actually permit. However, in accordance with the invention the receiver continuously monitors the $E_s/N_0$, typically on a frame by frame basis, so any changes in $E_s/N_0$ will be detected quickly.

Note that the transmitter determines how much parity to send initially. If the initial amount of parity is too low and the channel error rate very high, on the order of 0.5 for example, the probability of an undetected error at the receiver might become unacceptably high. This can be avoided by always initiating communications with frames that include all parity bits, thus yielding a throughput close to the rate of the mother code. When the receiver has had time to measure the actual channel $E_s/N_0$, the amount of parity initially transmitted can be reduced to an appropriate level to maximize throughput as described above.

Since the full mother code decoder is used each time any new parity bits are transmitted, sending small parity increment blocks with multiple NAKs returned until a frame is accepted can lead to high computational complexity at the receiver. Similarly, such an approach can lead to many NAKs and high feedback channel traffic. In the receiver-controlled embodiment of the invention, the number of times parity is sent to the receiver is minimized. This reduces the feedback channel traffic and the number of times the receiver will attempt to decode a frame. Additionally, the receiver will tell the transmitter to transmit a quantity of initial parity that will give a low FER at the receiver. At low FERs, the decoder will typically require few iterations on average, thus further reducing the decoder computational complexity.

HARQ protocols can be used in delay-insensitive applications. However, the nature of many current and future communications systems is such that both delay-sensitive and delay-insensitive communications may occur in a single system. An example of such a system is one that involves wireless Internet services that allow for a full range of Internet based applications from a portable web browsing device. Many web-based applications are delay-insensitive. These include for example downloading a typical web page, downloading files, e-mail and even streaming audio and video, such as RealAudio and RealVideo. In fact, many streaming audio and video applications implement their own ARQ protocols. However, other real-time web based applications, such as voice over internet protocol (IP), live videoconferencing and online gaming, are very delay-sensitive. Even within delay-sensitive applications, required performance might vary. For example, different applications might require different BERs.

The term quality of service (QoS) refers to the fact that many different types and quality of services might be required from a communications system. The system might have to perform different functions and process the data differently depending on the nature of the data. There is much work underway to incorporate the idea of QoS into communications systems. For the purposes of this disclosure, it is assumed that some field or frame in the incoming data indicates the desired quality of service (i.e., delay-sensitive or delay-insensitive). For example, the evolving General Packet Radio Service (GPRS) systems support different QoS requirements.

The instant invention can easily accommodate delay-sensitive and delay-insensitive communications. The only difference in operation is that in the delay-sensitive case, no retransmission requests are sent on the feedback channel. Enabling and disabling of retransmission requests will be controlled by the transmitter, which will have access to the necessary QoS information. When initiating communications, the transmitter will tell the receiver whether or not retransmissions are enabled. The receiver will still monitor the channel $E_s/N_0$ and select an appropriate amount of parity to send and this process will continue to dynamically track the channel state throughout the duration of communication. In this way, a single HARQ protocol can allow both delay-sensitive and delay-insensitive communications at the maximum possible throughput in a seamless and efficient manner.

On particular contemplated application of the invention is MOST (Microvariability and Oscillations of STars), a planned Canadian Space Agency space telescope. It is a low earth orbiting (LEO) satellite currently under development at the University of Toronto's Institute of Aerospace Studies. MOST's 15 cm aperture telescope will be used for long-term (over months) observations of slight variations in intensity of target stars. This data is used in the field of astroseismology to investigate the internal composition, age and structure of stars. These measurements can only be made from a space-based observatory free of the atmospheric distortions and scintillations that affect earth-based astronomy.

The current mission plan is for the MOST spacecraft to orbit the earth in a dawn-dusk sun-synchronous orbit at an altitude of 765 km, inclined 98.5° to the equatorial plane. The orbit period is approximately 90 minutes and the dawn-dusk sun-synchronous nature of the orbit means that the satellite will always be orbiting over the earth's terminator (the day-night dividing line). The spacecraft will only download data when it has access to one of two ground stations, to be located in Toronto and Vancouver. Each ground station will see between 4 and 6 passes of the satellite per day, for a total time of approximately 60 minutes per day per ground station. During the time in which the ground station sees the spacecraft, it may be as close as 765 km if it is directly overhead or over 3000 km away if it is near the horizon. The link analysis of any satellite communications system accounts for the path or free space loss, which is a function of the distance between the satellite and the ground station. The result of this varying path loss is that the channel between MOST and the ground is non-stationary. The SNR at the receivers on both the ground and the spacecraft will vary as the spacecraft moves through its orbit.

The communications challenge is to download 2 Mbytes of daily telemetry at the lowest possible SNR in the limited download time. In particular, the spacecraft to ground station side of the link is critical. Power is a scarce system resource in spacecraft. Reducing power consumption reduces the required size of the solar cells and the spacecraft batteries, which in turn reduces mass and launch cost. The current MOST communications system architecture is based on the AX.25 packet radio network protocol. This protocol uses a pure SR-ARQ system with no FEC. The throughput of such a system corresponds to the worst curve in FIG. 18. In comparison to the turbo HARQ throughput curve in the same Figure, it is clear that turbo HARQ can achieve the same throughputs as pure ARQ at lower SNRs. For example, the turbo HARQ system can achieve throughputs of 0.8 and 0.5 at SNRs of approximately 2 dB and −2 dB respectively, whereas the pure ARQ approach currently planned for the MOST mission can achieve these throughputs only at much higher SNRs, approximately 7 dB and 6 dB, respectively. In addition, using turbo HARQ only on the space to earth segment implies that the spacecraft need only implement the turbo encoder, not the decoder. The computational complexity of the turbo encoder is low and therefore will not impose significant extra requirements on spacecraft systems. The nonstationary channel that results from the LEO orbit is an ideal application for the channel adaptive capabilities of turbo HARQ.

MOST currently has a power budget of approximately 40 Watts, of which 5 W is allocated to the communications systems. Using a turbo HARQ approach could reduce this by a factor of 4, assuming 6 dB improvement. In MOST, the majority of power is consumed by a sophisticated 3-axis attitude control system. Though a power savings of over 2 W is significant, equivalent to 5% of the total power, it is not an enormous savings. However, in many other LEO satellites, especially those dedicated to communications, similar savings in transmitter power can have an enormous impact on spacecraft size, complexity, mass and cost. Therefore, turbo HARQ offers a significant advantage in many LEO satellite communications applications, including paging, messaging and broadband data communications.

Mobitex™, a narrowband frequency modulation (FM) terrestrial communications system with 12.5 kHz wide channels at 900 MHz, is another contemplated application for the instant invention. It is a multi-user cellular type system and is used for fairly low data rate applications, such as messaging and e-mail. Mobitex uses a type-I hybrid ARQ communications protocol. A (12,8) Hamming code is used for error correction and thus sets the maximum possible throughput at 0.667. When packets are retransmitted, the old packets are discarded so there is no packet combining.

Such a system may significantly benefit from the inventive HARQ schemes. Power is a precious commodity in the mobile units operating on the Mobitex network. There is a constant effort, driven by consumer demands, to reduce the size and power consumption of portable data devices. When transmitting, these devices can transmit at 2 W. A typical device operating on the Mobitex network might use 2 AA batteries for 2 weeks of operation. The throughput improvement gained through the use of turbo HARQ could allow a system similar to Mobitex to require less mobile transmit power and exhibit increased system capacity. Lower transmit power would provide for increased battery life and thereby reduced operating costs for mobile device users. The capacity improvement is a direct result of higher throughput. A higher throughput means that an individual user needs a narrower channel, or less time slots in a time-division multiple access (TDMA) system, to successfully transmit data. This allows for more users and hence a greater capacity.

The current generation of digital wireless cellular systems are known as personal communications systems (PCS). PCS represents the second generation of cellular that has now largely replaced original analog telephony systems, including the so-called advanced mobile phone system (AMPS) and total access communication system (TACS). There are several different PCS standards based on different multiple access protocols, including the global system for mobile communications (GSM), which operates based on time-division and frequency-division multiple access (TDMA/FDMA) and IS-95, based on code-division multiple access (CDMA). Although PCS systems are digital, they are still largely oriented towards voice communications. However, they have provisions for data communications and some service providers are now beginning to offer data services, such as e-mail access.

There is currently a great deal of work underway to define the third generation of cellular communications, often referred to as IMT2000. One key goal of IMT2000 is to avoid the multiple standards and resulting market fragmentation and incompatibility that exists with current PCS systems. In addition, there is a greater recognition of the importance of wireless data communications and the IMT2000 standard is being designed from the start with data in mind. IMT2000 will be based on CDMA as its multiple access technique.

One key aspect of IMT2000 is the need to accommodate many different qualities of service, discussed above. A channel adaptive communications protocol that uses turbo HARQ in delay insensitive applications and variable rate FEC for delay sensitive applications offers many advantages in such systems. One such advantage of the invention in mobile communication systems is its lower power operation. Additionally, the capacity of quasi-orthogonal CDMA systems is determined to a significant degree by the transmit power of the individual users. By achieving a good throughput at reduced power, turbo HARQ allows CDMA systems to maximize the system capacity in a dynamic and flexible manner.

It will be appreciated that the above description relates to preferred embodiments by way of example only. Many variations on the invention will be obvious to those knowledgeable in the field, and such obvious variations are within the scope of the invention as described and claimed, whether or not expressly described.

For example, the invention is not restricted to the particular simulated implementations. Other turbo and LDPC codes and ARQ schemes other than SR-ARQ are possible. Similarly, the invention may be integrated into other communication systems and devices than those described above. The invention may be applicable to virtually any communication device operating with an ARQ protocol.

Wireless modems such as those disclosed in U.S. Pat. No. 5,619,531, titled "Wireless Radio Modem with Minimal Interdevice RF Interference", issued on Apr. 8, 1997, and U.S. Pat. No. 5,764,693, titled "Wireless Radio Modem with Minimal Inter-Device RF Interference", issued on Jun. 9, 1998, both assigned to the assignee of the instant invention, represent types of communication devices in which the invention may preferably be implemented. The disclosures of these patents are incorporated herein by reference. In further preferred embodiments, the invention may be configured to operate in conjunction with small mobile communication devices having limited power, such as those disclosed in co-pending U.S. patent application Ser. No. 09/106,585, titled "Hand-Held Electronic Device With a Keyboard Optimized for Use With the Thumbs", the disclosure of which is incorporated into this description by reference. Other systems and devices in which the invention may be implemented include, but are not limited to, further fixed or mobile communication systems, hand-held communication devices, personal digital assistants (PDAs) with communication functions, cellular phones and two-way pagers.

What is claimed is:

1. A data communication method for puncturing parity bits generated by an encoder, comprising:

storing the parity bits in a memory;

initializing an accumulator associated with the parity bits stored in the memory to an initial value; and for each parity bit stored in the memory:

i. incrementing the accumulator by an increment value; and ii. if the accumulator overflows, selecting at least one of the parity bits stored in the memory for transmission;

wherein the initial value and the increment value are selected to achieve a preselected amount of puncturing.

2. The method of claim 1, further comprising:
determining if the number of selected parity bits is equal to the number of parity bits required for the preselected amount of puncturing; and
arbitrarily selecting one parity bit if the number of selected parity bits is one less than the number of parity bits required for the preselected amount of puncturing.

3. The method of claim 1, further comprising:
transmitting the selected parity bits within a frame of data;
receiving an error indication regarding the transmitting of the frame of data;
determining that at least one of the parity bits has not been transmitted;
initializing the accumulator to a value equal to a multiple of the increment value;
selecting a second increment value; and
for each non-transmitted parity bit:
  i. incrementing the accumulator by the second increment value; and
  ii. if the accumulator overflows, selecting the non-transmitted parity bit for retransmission with the frame.

4. The method of claim 1, further comprising:
transmitting the selected parity bits within a frame of data;
receiving an error indication regarding the transmitting of the frame of data;
initializing the accumulator to a second initial value; and
for each parity bit:
  i. incrementing the accumulator by the increment value; and
  ii. if the accumulator overflows, selecting at least one of the parity bits for retransmission of the frame.

5. The method of claim 1, wherein:
the accumulator is an a-bit accumulator, wherein a-bit is indicative of a bit storage size of the accumulator, and wherein the increment value is based upon the bit storage size of the accumulator.

6. The method of claim 1, wherein:
the increment value is preselected based upon the preselected amount of puncturing.

7. The method of claim 1, wherein:
the puncturing is performed in a hybrid automatic repeat request (HARQ) communication system.

8. The method of claim 1, wherein the encoder is a turbo encoder.

9. The method of claim 1, wherein:
the initial value and the increment value are selected according to a puncturing mask.

10. A communication device, comprising:
an encoder for encoding input information to generate encoded information;
a memory for storing parity bits associated with the encoded information;
an accumulator associated with the parity bits stored in the memory and set to an initial value; and
a communication signal transmitter, configured to respond to each parity bit stored in the memory, by (i) incrementing the accumulator by an increment value, and (ii) determining if the accumulator overflows, and if so then selecting at least one of the parity bits stored in the memory for transmission;
wherein the initial value and the increment value are selected to achieve a preselected amount of puncturing.

11. The communication device of claim 10, wherein the communication signal transmitter is further configured to: (iii) determine if the number of selected parity bits is equal to the number of parity bits required for the preselected amount of puncturing; and (iv) arbitrarily select one parity bit if the number of selected parity bits is one less than the number of parity bits required for the preselected amount of puncturing.

12. The communication device of claim 10, wherein the communication signal transmitter is further configured to transmit the selected parity bits within a frame of data.

13. The communication device of claim 12, further comprising:
a communication signal receiver configured to receive an error indication regarding the transmitting of the frame of data.

14. The communication device of claim 13, wherein the communication signal transmitter is further configured to: (iii) determine that at least one of the parity bits has not been transmitted; (iv) initialize the accumulator to a value equal to a multiple of the increment value; (v) select a second increment value; and (vi) for each non-transmitted parity bit, increment the accumulator by the second increment value, and if the accumulator overflows, select the non-transmitted parity bit for retransmission with the frame.

15. The communication device of claim 10, wherein:
the accumulator is an a-bit accumulator, wherein a-bit is indicative of a bit storage size of the accumulator, and wherein the increment value is based upon the bit storage size of the accumulator.

16. The communication device of claim 10, wherein:
the increment value is preselected based upon the preselected amount of puncturing.

17. The communication device of claim 10, wherein:
the puncturing is performed in a hybrid automatic repeat request (HARQ) communication system.

18. The communication device of claim 10, wherein the encoder is a turbo encoder.

19. The communication device of claim 10, wherein:
the initial value and the increment value are selected according to a puncturing mask.

20. A communication method, comprising:
(a) encoding input information to generate encoded information, error check information and parity bits according to a low density parity check (LDPC) encoding scheme;
(b) puncturing the parity bits to generate incremental parity blocks using a buffer for storing the parity bits and an accumulator which is initialized to an initial value, the puncturing further comprising, for each parity bit in the buffer, the acts of incrementing the accumulator by an increment value and, if the accumulator overflows, selecting at least one of the stored parity bits for an incremental parity block, wherein the initial value and the increment value are selected to achieve a preselected amount of puncturing;
(c) assembling the encoded information and error check information into transmission signal blocks; and
(d) transmitting each assembled transmission signal block to a receiver on a communication medium.

21. The communication method of claim 20, further comprising:
(e) if a repeat request for a particular transmission signal block is received from the receiver, then:
  (i) assembling one of the incremental parity blocks associated with the particular transmission signal block into a incremental parity transmission signal block;

(ii) transmitting the incremental parity transmission signal block to the receiver; and
(iii) repeating steps (i) and (ii) for each subsequent repeat request for the particular transmission signal block until all incremental parity blocks have been transmitted.

22. The method of claim 20, wherein the puncturing acts are repeated until all parity bits have been selected for an incremental parity block.

* * * * *